US009326086B2

(12) United States Patent
Tsang

(10) Patent No.: US 9,326,086 B2
(45) Date of Patent: Apr. 26, 2016

(54) NEURAL INDUCED ENHANCEMENT OF AUDIO SIGNALS

(71) Applicant: City University of Hong Kong, Kowloon (HK)

(72) Inventor: Peter Wai Ming Tsang, Kowloon (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 117 days.

(21) Appl. No.: 14/186,706

(22) Filed: Feb. 21, 2014

(65) Prior Publication Data

US 2015/0245156 A1   Aug. 27, 2015

(51) Int. Cl.
| | |
|---|---|
| H04R 5/00 | (2006.01) |
| H04S 7/00 | (2006.01) |
| H04R 29/00 | (2006.01) |
| H04S 1/00 | (2006.01) |
| H04R 3/00 | (2006.01) |
| H03G 3/00 | (2006.01) |

(52) U.S. Cl.
CPC .......... *H04S 7/30* (2013.01); *H03G 3/001* (2013.01); *H04R 3/00* (2013.01); *H04R 29/00* (2013.01); *H04S 1/002* (2013.01)

(58) Field of Classification Search
None
See application file for complete search history.

(56) References Cited

U.S. PATENT DOCUMENTS

| | | | |
|---|---|---|---|
| 4,140,997 A | 2/1979 | Brady | |
| 4,748,669 A | 5/1988 | Klayman | |
| 4,866,774 A | 9/1989 | Klayman | |
| 4,910,778 A | 3/1990 | Barton | |
| 5,213,338 A | 5/1993 | Brotz | |
| 5,403,261 A | 4/1995 | Shimizu et al. | |
| 5,892,830 A | 4/1999 | Klayman | |
| 5,970,153 A | 10/1999 | Petroff | |

(Continued)

FOREIGN PATENT DOCUMENTS

WO     2007096610     8/2007

OTHER PUBLICATIONS

F. Gunnarsson, "Single Bipolar Loudspeaker System for Stereo Reproduction", http://www.embracingsound.com/docs/SingleBipolarLoudspeakersystemforstereoreproductionb0.91.pdf; Last accessed May 21, 2014.

(Continued)

*Primary Examiner* — Muhammad N Edun
(74) *Attorney, Agent, or Firm* — Amin, Turocy & Watson, LLP

(57) ABSTRACT

Neural induced enhancement of audio signals is provided to facilitate improving the listening pleasure of a user. An audio processor component can detect brain waves of a user at different frequency bands, analyze the brain wave signal in each of the different frequency bands, and can adjust one or more audio enhancement effects based at least in part on the results of the analysis. The audio processor component can adjust a spatial effect of audio signals, integrate a periodic or random variation on a spatial widening effect of audio signals, adjust a spatial effect of delayed audio signals, integrate a periodic or random variation on a spatial widening effect of the delayed audio signals, or adjust another audio enhancement effect(s) based at least in part on the analysis results, comprising information relating to the respective strengths of the one or more different frequency bands of the brain waves.

32 Claims, 9 Drawing Sheets

(56) References Cited

U.S. PATENT DOCUMENTS

| | | |
|---|---|---|
| 6,330,339 B1 | 12/2001 | Ishige et al. |
| 6,875,167 B2 | 4/2005 | Yoon |
| 7,010,128 B1 | 3/2006 | Heed et al. |
| 7,127,283 B2 | 10/2006 | Kageyama |
| 7,146,010 B1 | 12/2006 | Heed et al. |
| 7,674,224 B2 | 3/2010 | Hewett |
| 7,717,842 B2 | 5/2010 | Kwon et al. |
| 7,988,557 B2 | 8/2011 | Soderlund |
| 8,430,806 B2 | 4/2013 | Ni et al. |
| 8,597,171 B2 | 12/2013 | Altman et al. |
| 8,755,782 B2 * | 6/2014 | Lim .................. G06F 13/42 340/1.1 |
| 2012/0049998 A1 | 3/2012 | Lim et al. |
| 2014/0063055 A1 | 3/2014 | Osterhout et al. |

OTHER PUBLICATIONS

F. Gunnarsson, "EmbracingSound™ Tech Summary," http://www.embracingsound.comldocslEmbracingSoundTechSummary.pdf; Last accessed May 21, 2014.

Non-Final Office Action mailed Dec. 31, 2015 for U.S. Appl. No. 14/520,272, 28 pages.

* cited by examiner

NEURAL INDUCED ENHANCEMENT OF AUDIO SIGNALS

TECHNICAL FIELD

The subject disclosure relates generally to signal processing, e.g., to neural induced enhancement of audio signals.

BACKGROUND

With a traditional multi-channel (e.g., stereo) audio system, the sound field recorded in an environment can be reconstructed with two or more speakers (e.g., loudspeakers). Through the speakers, a listener may be able to enjoy the music represented by the reconstructed sound field. However, due to the limitation of conventional recording and playback devices, the realistic sense of the replayed music can be insufficient, which can thereby lower the listening pleasure for the listener. Although there are some conventional techniques for enhancing the spatial effect of an audio signal, such conventional techniques typically are not operating according to the expectation of the listener in an autonomous manner. As a result, some listeners may find the audio enhancement experience, based on such conventional techniques, to be dissatisfying, weakened over prolong period of time, or too overwhelming to the listener. Although the audio enhancement effect can be adjusted manually through some user interface (e.g., buttons, dials), this can result in the process of enjoying the music being distracted from the listener's perspective, and the listening pleasure of the listener may be reduced accordingly.

The above-described description is merely intended to provide a contextual overview relating to digital holograms, and is not intended to be exhaustive.

SUMMARY

The following presents a simplified summary of various aspects of the disclosed subject matter in order to provide a basic understanding of some aspects described herein. This summary is not an extensive overview of the disclosed subject matter. It is intended to neither identify key or critical elements of the disclosed subject matter nor delineate the scope of such aspects. Its sole purpose is to present some concepts of the disclosed subject matter in a simplified form as a prelude to the more detailed description that is presented later.

One or more embodiments, such as one or more systems, methods, computer readable storage mediums, and techniques disclosed herein, relate to processing and generating audio signals. Disclosed herein is a system comprising at least one memory that stores computer-executable components, and at least one processor that executes or facilitates execution of the computer-executable components. The computer-executable components comprise a detector component that detects a set of signals associated with brain activity of a brain of a user, wherein the set of signals comprises at least a first signal associated with a first frequency band and a second signal associated with a second frequency band. The computer-executable components also comprise an audio processor component that controls application of one or more audio effects to audio signals generated by an audio device, based at least in part on a result of an analysis of the set of signals, to generate processed audio signals for presentation to the user.

Also disclosed herein is a method that comprises sensing, by a system comprising a processing device, a set of brain wave signals associated with brain activity of a user, wherein the set of brain wave signals comprises at least a first brain wave signal associated with a first frequency band and a second brain wave signal associated with a second frequency band. The method also comprises controlling, by the system, application of a set of audio effects to audio signals generated by an audio device, based at least in part on a result of an analysis of the set of brain wave signals, to generate processed audio signals for presentation to the user.

Further disclosed herein is a non-transitory computer-readable medium storing computer-executable instructions that, in response to execution, cause a system comprising a processor to perform operations. The operations comprise detecting a set of brain wave signals associated with brain activity of a user, wherein the set of brain wave signals comprises at least a first brain wave signal associated with a first frequency band and a second brain wave signal associated with a second frequency band. The operations also comprise managing application of a set of audio effects to multiple-channel audio signals generated by an audio system, based at least in part on a result of analyzing the set of brain wave signals, to generate processed audio signals for presentation to the user.

The disclosed subject matter also includes a system comprising means for sensing a set of signals associated with brain activity of a user, wherein the set of signals comprises at least a first signal associated with a first frequency band and a second signal associated with a second frequency band. The system also comprises means for controlling application of a set of audio effects to multiple-channel audio signals generated by an audio system, based at least in part on a result of an analysis of the set of signals, to generate processed audio signals for presentation to the user.

The following description and the annexed drawings set forth in detail certain illustrative aspects of the disclosed subject matter. These aspects are indicative, however, of but a few of the various ways in which the principles of the disclosed subject matter may be employed, and the disclosed subject matter is intended to include all such aspects and their equivalents. Other advantages and distinctive features of the disclosed subject matter will become apparent from the following detailed description of the disclosed subject matter when considered in conjunction with the drawings.

DETAILED DESCRIPTION

Figure 1:
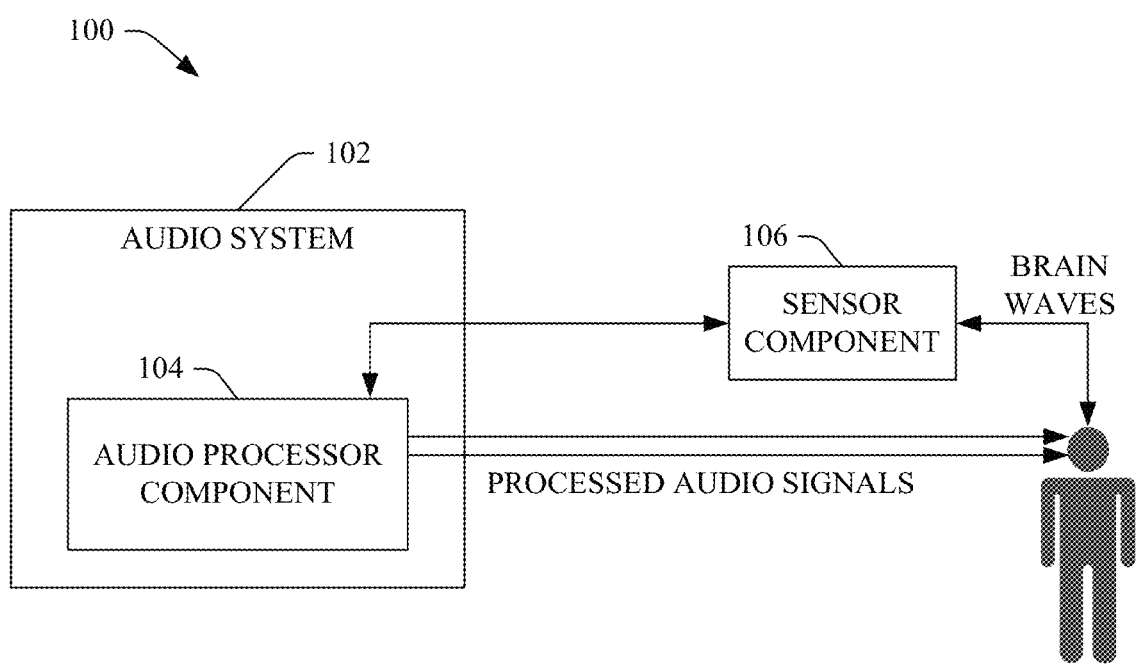
FIG. 1 illustrates a block diagram of an example system that can control application of one or more audio effects to audio signals of an audio presentation based at least in part on the brain wave signals of a user(s), in accordance with various aspects and embodiments of the disclosed subject matter.

The disclosed subject matter is described with reference to the drawings, wherein like reference numerals are used to refer to like elements throughout. In the following description, for purposes of explanation, numerous specific details are set forth in order to provide a thorough understanding of the various embodiments of the subject disclosure. It may be evident, however, that the disclosed subject matter may be practiced without these specific details. In other instances, well-known structures and devices are shown in block diagram form in order to facilitate describing the various embodiments herein.

With regard to listening to sounds, such as music, there can be a relationship between the listening pleasure of a human being and the psychology of the human, and such relationship has been of interest amongst psychologists, musicians, and others. The listening pleasure of a person often can be found to be related to "expectation" and "habituation." Expectation can mean that a listener can be anticipating certain information to be heard in the future, which generally can lead to a certain level of pleasure. Thwarted expectations, on the other hand, may cause uneasiness or anxiety for the listener. It is posited that expectation can be learned. As such, the expectation heuristics adopted by a listener can be an encapsulation of the music itself, anticipating sounds on the basis of what has been heard by the listener. Extending this a bit further, if the listener can repetitively exert some changes to the music and evaluate the modified version afterwards, he or she can come up with a piece of music that can match with the expectation of the listener, hence leading to more listening pleasure to the user than the original version of the music. The second psychological factor, "habituation," typically can refer to the sense of boredom a person (e.g., a listener) can experience when a piece of stimuli (e.g., the music in this case) is repeated too often to the person, so that there is no longer any surprising element to the person when subjected to the stimuli. One can imagine that if an identical piece of music is repeated too many times, the listening pleasure will increase initially because the content is becoming more and more familiar, and hence more predictable by the listener. However, as time goes by, the listening pleasure may drop as habituation steps in, for example, causing a sense of drowsiness as well as lowering the arousal levels and attentiveness of the listener.

Outcomes derived from the study on the psychology of listening can be and have been successfully applied in the music composition. For instance, the analysis of the melodic structure in terms of factors like pitch proximity, step inertia, post-skip reversal, and central pitch tendency. Conventional analytical approaches also have been adopted, such as the use of probabilities in modeling the transition between adjacent tones, and the information theory. However, such conventional analytical approached typically involve the changing of the original composition of the music.

With a traditional multi-channel (e.g., stereo) audio system, the sound field recorded in an environment can be reconstructed with two or more speakers (e.g., loudspeakers). Through the speakers, a listener may be able to enjoy the music represented by the reconstructed sound field. However, due to the limitation of conventional recording and playback devices, the realistic sense of the replayed music can be insufficient, which can thereby lower the listening pleasure for the listener.

There are some conventional techniques for changing, for example, an audio effect (e.g., the spatial effect, filtering, delay, channel mixing) on an audio signal. However, such conventional techniques typically are not operating according to the expectation of the listener in an autonomous manner. Further, different users can have their own expectation on the sense of listening pleasure, and such listening pleasure of users can change based on a number of factors, such as, for example, time, environment where the listening is occurring, and/or the emotion(s) (e.g., emotional state(s)) of the listener. The impression imposed on different listeners with the use of such conventional techniques can be uncertain, especially after a prolong period of listening. As a result, some listeners may find the audial experience, based on such conventional techniques, to be dissatisfying, weakened over prolong period of time, or too overwhelming to the listener.

For instance, such conventional techniques for audio modification can suffer from shortcomings relating to the aforementioned psychological factors (e.g., expectation, habituation) associated with the psychology relating to listening to sound (e.g., music). As a result, additional pleasure may not be apparent if a piece of music that has been heard before, and has been modified with a static effect, is conveyed to the listener. For example, even if adding a low boost filter can increase the listening pleasure on the low frequency signal for the listener, such surprising sensation will seem to fade with time to the listener as the listener becomes more used to the low-boost-filter effect. This can be a typical case of the Wittgenstein's paradox, where no surprise can exist if one already knows exactly what will be heard.

Certain conventional techniques also can enable the audio enhancement effect to be adjusted manually through some user interface (e.g., buttons, dials). For instance, such techniques often can involve combining the left and right channels according to certain predefined settings that typically have not taken into account the expectation of the listener, wherein, if the listener is not satisfied with the audio effect applied to the audio being presented to the listener, the listener has to modify the settings manually using certain controlling devices in order to adjust the audio presentation to the listener's liking. Consequently, such conventional techniques for manual audio enhancement can result in the process of enjoying the music being distracted from the listener's perspective, and the listening pleasure of the listener may be reduced accordingly. Even worse, a wrong manual setting made by a listener may even further lower the perceptual quality of the music from the listener's perspective.

Brain wave (e.g., neural) technology also can be applied to audio-related applications as well. For instance, existing brain wave technology has typically been applied in toys, simple control, music composition, and treatment, such as, for example, hypnotism. In applications like hypnotism or neural feedback, a foreign audio signal that is intended to strengthen or induce certain aspect(s) of the brain activity can be added to the music. For applications like music composition, a piece of music can be formed by integrating short time segments of audio signals, each selected according to certain aspect(s) of the brain wave.

To that end, presented are techniques for neural induced enhancement of audio signals presented by an audio system (e.g., a multi-channel audio system) to a user to facilitate improving the listening pleasure of the user who is listening to the audio signals. The disclosed subject matter can perform neural induced enhancement of audio signals presented to the user by performing suitable processing on the audio signals. In processing the audio signals, the disclosed subject matter also can take into account that different users can have different expectations on the sense of listening pleasure when listening to an audio presentation, and also can take into account that the respective listening pleasures of respective users can change based at least in part on a variety of factors, such as, for example, time, environment, and the respective emotions of the users (e.g., at the time a user is listening to the audio presentation).

In some implementations, an audio processor component can monitor the mental state of the user via the brain wave signals (e.g., electroencephalographic (EEG) brain wave signals) of the user at different frequency bands and can adjust (e.g., automatically or dynamically adjust) one or more audio effects (e.g., audio enhancement effects) associated with (e.g., applied to) audio signals of an audio and/or visual presentation based at least in part on (e.g., in response to) results of an analysis of the brain wave signals of the user at the different frequency bands. For a user, the brain wave signals in different frequency bands typically can vary (e.g., the signal strengths of brain wave signals in different frequency bands can vary) in response to hearing the audio signals or processed audio signals and/or in response to other stimuli perceived or experienced by the user while listening to the audio signals or processed audio signals. The audio processor component can evaluate these changes in brain wave signals in different frequency bands in response to hearing the audio signals or processed audio signals and/or in response to other stimuli perceived or experienced by the user while listening to the audio signals or processed audio signals, and can adjust one or more audio effects that can be applied to the audio signals to process the audio signals presented to the user to facilitate improving the listening experience for the user.

With regard to the process of neural induced enhancement of the audio signals, a user (e.g., listener) can choose to facilitate performance of this process subconsciously, in which case the audio enhancement can be performed by the audio processor component tracking and following the mental state or emotion of the user. That is, the disclosed subject matter can provide various means for enabling the pleasure of listening to an audio presentation by the user to be adjusted according to the mental state of the user in a sub-conscious and autonomous manner. In other implementations, the user also can modify the user's brain wave intentionally by invoking certain mental activities (e.g., such as by the user deliberately increasing or decreasing the user's attention to the audio presentation) to facilitate performance of the process for the neural induced enhancement of the audio signals by the audio processor component. For instance, in accordance with the disclosed subject matter, with suitable training, the adjustment of the listening pleasure of a user with regard to an audio presentation can be made or facilitated by the user through deliberate control of user's mental state or emotion.

In some implementations, a sensor component, which can comprise one or more sensors, can be associated with the user (e.g., listener). The sensors can monitor and sense brain wave signals (e.g., in different frequency bands) or other physical signals (e.g., facial expression, eye response, hand gestures, etc.) of the user, for example, in response to perceiving (e.g., listening to, watching, etc.) an audio and/or visual presentation, such as a song, a video (e.g., music video), a movie, a television program, etc. In some implementations, the one or more sensors can be wirelessly associated with (e.g., wirelessly connected to) the user such that the one or more sensors can sense or detect the brain wave signals or other physical signals of the user by being in contact with the user or in proximity to the user. These one or more sensors also can be part of or associated with an electronic device with communication and/or computing capabilities that can wirelessly communicate information relating to the brain wave signals or other physical signals of the user to the audio processor component for analysis by the audio processor component to facilitate controlling application of the one or more audio effects to the audio signals being presented to the user. For example, the one or more sensors can be part of or associated with a mobile phone, an electronic pad or tablet, a computer, electronic eyewear having communication and/or computing capabilities, or another electronic device that can be used to communicate (e.g., wirelessly communicate) the information relating to the brain wave signals or other physical signals of the user to the audio processor component. In other implementations, the one or more sensors can be connected to the user and/or the audio processor component in a wired manner, wherein the one or more sensors can communicate information relating to the brain wave signals or other physical signals of the user to the associated electronic device and/or to the audio processor component via a wireline communication connection.

For instance, one or more sensors can be integrated with a set of earbuds or earphones worn by the user while perceiving the audio presentation, wherein the set of earbuds or earphones can be connected via a wireline or wireless communication connection to an electronic device (e.g., mobile phone, electronic pad or tablet, computer, audio player, etc.) and/or to the audio processor component. As another example, one or more sensors can be integrated into the arms, end pieces, or frame of a pair of electronic glasses worn by the user while perceiving the audio presentation, wherein the one or more sensors can be connected via a wireless or wireline communication connection to another electronic device (e.g., mobile phone, electronic pad or tablet, computer, audio player, etc.) and/or to the audio processor component.

The audio processor component can receive the information relating to the brain wave signals or other physical signals of the user from the sensor component or associated electronic device. The audio processor component can detect or determine the brain wave signals of the user in different frequency bands and/or can detect other physical signals of the user based at least in part on the received information relating to the brain wave signals or other physical signals of the user.

The audio processor component can analyze the brain wave signals in each of the different frequency bands and/or the information relating to other physical signals of the user to facilitate determining (e.g., automatically or dynamically determining) an adjustment(s) that can be made to one or more audio effects that can be applied to the audio signals to facilitate improving the listening pleasure of the user. For example, as part of the analysis, the audio processor component can determine or measure the respective strengths of the brain wave signals of one or more different frequency bands associated with a user (e.g., in response to perceiving the audio signals), wherein the mental state of the user can be reflected at least in part from the respective signal strengths of the different frequency bands of the brain waves of the user. The audio processor component can determine an adjustment(s) that can be made to one or more audio effects that can be applied to the audio signals, based at least in part on the respective strengths of the brain wave signals of one or more different frequency bands associated with a user, to facilitate improving the listening pleasure of the user (e.g., based on the determined mental state of the user). As another example, as part of the analysis, the audio processor component can determine, identify, or infer a facial expression, a gesture (e.g., hand or finger gesture), eye response, etc., of the user in response to perceiving the audio signals, and can determine an adjustment(s) that can be made to one or more audio effects that can be applied to the audio signals, based at least in part on the analysis results relating to the facial expression, gesture, eye response, etc., of the user, to facilitate improving the listening pleasure of the user.

Based at least in part on the results of the analysis, the audio processor component can adjust (e.g., automatically or dynamically adjust) the application of the one or more audio effects to the audio signals accordingly (e.g., based on the determined effects adjustments) to facilitate improving, enhancing, or promoting the listening experience of the user through such enhanced processing of the audio signals. For instance, the audio processor component can adjust a spatial widening effect of audio signals (e.g., as perceived by the user), integrate a periodic or random variation on a spatial widening effect of audio signals, adjust a spatial widening effect of delayed audio signals (e.g., as perceived by the user), or integrate a periodic or random variation on a spatial widening effect of the delayed audio signals based at least in part on the analysis results, which can comprise information relating to the respective strengths of the one or more different frequency bands of the brain waves. For example, the audio processor component can monitor (e.g., continuously monitor, periodically monitor, or monitor in response to an occurrence of an event) the mental state of the user via the brain waves of the user for different frequency bands and can adjust the one or more audio effects based at least in part on the respective strengths of the brain wave signals for the one or more different frequency bands.

Turning to FIG. 1, illustrated is a block diagram of an example system 100 that can control (e.g., adaptively control) application of one or more audio effects to audio signals of an audio presentation based at least in part on the brain wave signals of a user(s), in accordance with various aspects and embodiments of the disclosed subject matter. The system 100 can comprise an audio system 102 that can present audio signals (e.g., a song) to a user(s). In some implementations, the audio system 102 can be part of or associated with a content presentation system that can present audio signals and/or visual signals to a user(s) as part of an audio or visual presentation (e.g., a song, a video, a movie, a television program, etc.). The system 100 can enable neural induced enhancement of audio signals presented by the audio system 102 to a user to facilitate improving the listening pleasure of the user who is listening to the audio signals. In some implementations, the audio system 102 can be a multi-channel audio system comprising two or more audio channels and two or more audio speakers that can provide respective audio signals of an audio presentation. For example, the audio system 102 can comprise two audio channels (e.g., left or first channel, right or second channel) and two audio speakers that can present two respective audio signals in stereo, or four audio channels (e.g., left-front or first channel, right-front or second channel, left-rear or third channel, right-rear or fourth channel) and four audio speakers that can present four respective audio signals in quadraphonic sound.

The system 100 can comprise an audio processor component 104 suitably process the audio signals to facilitate neural induced enhancement of audio signals presented to the user by the audio system 102. The audio processor component 104 can perform such enhancement of audio signals without changing the basic composition (e.g., notes, tempo, beats, insertion, and deletion) of the music. Instead, the audio processor component 104 can effectuate the enhancement of listening pleasure through adaptive adjustment of one or more non-structural properties of an audio presentation (e.g., music), so that a desired (e.g., proper, favorable) balance between the expectation and habituation impression can be achieved and perceived by the user(s) (e.g., listener(s)).

To facilitate improving or promoting the listening pleasure from the psychological perspective of the listener, the audio processor component 104 can realize the enhancement of audio signals through, for example, dynamic modification (e.g., variance) of one or more of the following attributes (non-structural properties): magnitude, phase, delay, and/or mixing of multiple channels, of the audio signal. For example, the non-structural adjustment of audio signals can be, but is not limited to, the following: modification of the instantaneous magnitude of the time signal, modification of the instantaneous phase of the time signal, delay on one or more audio channels, and/or mixing of multiple channels of the audio signal. The audio processor component 104 can control the degree of enhancement of the audio signals through a set of signals that can be derived, via a conversion system (e.g., converter component of the audio processor component 104), from the brain waves of the listener.

In accordance with various aspects and implementations, the audio processor component 104 can take into account that different users can have different expectations on the sense of listening pleasure when listening to an audio presentation, and also can take into account that the respective listening pleasures of respective users can change based at least in part on a variety of factors, such as, for example, time, environment, and the respective emotions of the users (e.g., at the time a user is listening to the audio presentation). Also, with regard to the disclosed subject matter, it is not necessary for the listener to have any prior knowledge on how to adjust the audio effects applied to audio signals to attain the desired expectation of the listener, which generally can vary with different audio presentations (e.g., different pieces of music), the listening environment of the listener, the apparatus on which the audio presentation is being played, or the mood of the listener, for example. This is because the audio processor component 104 can perform the desired adjustment of the audio effected applied to the audio signals dynamically or automatically based at least in part on the listener's response (e.g., sub-conscious response or, optionally, conscious response) to listening to the audio presentation. It is to be appreciated though that, in some implementations, the audio processor component 104 can provide the listener an interface (e.g., buttons, controls, dials) that can enable the listener to manually adjust the application of the audio effects to the audio signals to facilitate manual manipulation of the schematic and veridical expectations of the listener with respect to the audio presentation.

In some implementations, the audio processor component 104 can monitor the mental state of a user listening to an audio presentation presented by the audio system 102 via the brain wave signals (e.g., EEG brain wave signals) of the user at different frequency bands, and can adjust one or more audio effects (e.g., audio enhancement effects) associated with (e.g., applied to) audio signals of the audio (and/or visual) presentation based at least in part on (e.g., in response to) results of an analysis of the brain wave signals of the user in the different frequency bands. For a user, the brain wave signals in different frequency bands typically can vary (e.g., the signal strengths of brain wave signals in different frequency bands can vary) in response to hearing the audio signals or processed audio signals and/or in response to other stimuli perceived or experienced by the user while listening to the audio signals or processed audio signals. The audio processor component 104 can evaluate these changes in brain wave signals in different frequency bands in response to the user hearing the audio signals or processed audio signals and/or in response to other stimuli perceived or experienced by the user while listening to the audio signals or processed audio signals. Based at least in part on the results of the evaluation, the audio processor component 104 can adjust (e.g., automatically or dynamically adjust) one or more audio effects (e.g., spatial widening effect, audio delay, reverb, equalization, audio filtering, channel mixing, etc.) that can be applied to the audio signals to process the audio signals presented to the user by the audio system 102 to facilitate improving the listening experience for the user.

With regard to the process of neural induced enhancement of the audio signals, a user (e.g., listener) can choose to facilitate performance of this process subconsciously, in which case the audio enhancement can be performed by the audio processor component 104 tracking and following the mental state or emotion of the user and adjusting the one or more audio effects (e.g., adjusting one or more parameters of one or more audio effects) accordingly. That is, the disclosed subject matter can provide various means for enabling the pleasure of listening to an audio presentation by the user to be adjusted according to the mental state of the user in a subconscious and autonomous manner. In other implementations, the user also can modify the user's brain wave intentionally by invoking certain mental activities (e.g., such as by the user deliberately increasing or decreasing the user's attention to the audio presentation) to facilitate performance of the process for the neural induced enhancement of the audio signals by the audio processor component 104. For instance, in accordance with the disclosed subject matter, with suitable training, the adjustment of the listening pleasure of a user with regard to an audio presentation presented by the audio system 102 can be made or facilitated by the user through deliberate control of user's mental state or emotion, which can be detected by the audio processor component 104 and used to facilitate performing the process of neural induced enhancement of the audio signals.

In some implementations, the system 100 can comprise a sensor component 106 that can be associated with (e.g., communicatively connected to) the audio processor component 104 and the user (e.g., listener). The sensor component 106 can comprise one or more sensors that can be configured or adapted to monitor, sense, and/or capture brain wave signals (e.g., in different frequency bands) or other physical signals (e.g., facial expression, eye response, hand gestures, etc.) of the user, for example, in response to perceiving (e.g., listening, watching, etc.) to an audio and/or visual presentation presented by the audio system 102, wherein the audio and/or visual presentation can be, for example, a song, a video (e.g., music video), a movie, a television program, etc. The sensor component 106 can thereby capture, via an interface, the response of the user to the audio signals of the audio or visual presentation from the user's brain waves as the user is listening to the audio signals.

In some implementations, the one or more sensors of the sensor component 106 can be wirelessly associated with (e.g., wirelessly connected to) the user such that the one or more sensors can sense or detect the brain wave signals or other physical signals of the user by being in contact with the user or in proximity to the user. In some implementations, these one or more sensors can be part of or associated with an electronic device with communication and/or computing capabilities that can wirelessly communicate information relating to the brain wave signals or other physical signals of the user to the audio processor component 104 for analysis by the audio processor component 104 to facilitate controlling application of the one or more audio effects to the audio signals being presented by the audio system 102 to the user. For example, the one or more sensors of the sensor component 106 can be part of or associated with a mobile phone, an electronic pad or tablet, a computer, electronic eyewear having communication and/or computing capabilities, an audio player, or another electronic device that can be used to communicate (e.g., wirelessly communicate) the information relating to the brain wave signals or other physical signals of the user to the audio processor component 104, which can be part of the electronic device or can be a separate component associated with the electronic device, wherein, in some implementations, the electronic device can comprise or be associated with the audio system 102. In other implementations, the one or more sensors can be connected to the user and/or the audio processor component 104 in a wired manner, wherein the one or more sensors can communicate information relating to the brain wave signals or other physical signals of the user to the associated electronic device and/or to the audio processor component 104 via a wireline communication connection.

For instance, one or more sensors of the sensor component 106 can be integrated with a set of earbuds or earphones worn by the user while perceiving the audio presentation presented by the audio system 102, wherein the set of earbuds or earphones can be connected via a wireline or wireless communication connection to an electronic device (e.g., mobile phone, electronic pad or tablet, computer, audio player, etc.) and/or to the audio processor component 104. As another example, one or more sensors of the sensor component 106 can be integrated into the arms, end pieces, or frame of a pair of electronic glasses worn by the user while perceiving the audio presentation presented by the audio system 102 to the user, wherein the one or more sensors can be connected via a wireless or wireline communication connection to another electronic device (e.g., mobile phone, electronic pad or tablet, computer, audio player, etc.) and/or to the audio processor component 104.

The audio processor component 104 can receive the information relating to the brain wave signals or other physical signals of the user from the sensor component 106 or associated electronic device. The audio processor component 104 can detect or determine (e.g., automatically or dynamically detect or determine) the brain wave signals of the user in different frequency bands and/or can detect other physical signals of the user based at least in part on the received information relating to the brain wave signals or other physical signals of the user.

The audio processor component 104 can analyze the brain wave signals in each of the different frequency bands and/or the information relating to other physical signals of the user to facilitate determining an adjustment(s) that can be made to one or more audio effects that can be applied to the audio signals to facilitate improving the listening pleasure of the user. For example, as part of the analysis, the audio processor component 104 can determine or measure the respective strengths of the brain wave signals of one or more different frequency bands associated with a user in response to perceiving the audio signals of the audio presentation, wherein the mental state of the user can be reflected at least in part from the respective signal strengths of the different frequency bands of the brain waves of the user. The audio processor component 104 also can detect, identify, or determine changes (e.g., variations) in the respective signal strengths of the brain wave signals of one or more different frequency bands associated with a user in response to the user perceiving the audio signals of the audio presentation (e.g., as the audio presentation continues to be presented to the user) and/or in response to other stimuli perceived or experienced by the user while listening to the audio signals or processed audio signals.

The audio processor component 104 can determine (e.g., automatically or dynamically determine) an adjustment(s) that can be made to one or more audio effects that can be applied to the audio signals, based at least in part on the respective strengths of the brain wave signals of one or more different frequency bands associated with a user, to facilitate improving the listening pleasure of the user (e.g., based on the determined mental state of the user). As another example, as part of the analysis, the audio processor component 104 also can determine, identify, or infer a facial expression, a gesture (e.g., hand or finger gesture), eye response, etc., of the user in response to perceiving the audio signals, and can determine an adjustment(s) that can be made to one or more audio effects that can be applied to the audio signals, based at least in part on the analysis results relating to the facial expression, gesture, eye response, etc., of the user, to facilitate improving the listening pleasure of the user. The adjustment(s) that can be made to the one or more audio effects can facilitate adjusting (e.g., modifying) one or more attributes (e.g., magnitude, phase, delay, and/or mixing of the multiple channels) associated with the audio signals.

Based at least in part on the results of the analysis, the audio processor component 104 can adjust (e.g., automatically or dynamically adjust) the application of (e.g., adjust the parameters or controls of) the one or more audio effects to the audio signals accordingly (e.g., based at least in part on the determined effects adjustments) to facilitate improving, enhancing, or promoting the listening experience of the user through such enhanced processing of the audio signals. For instance, the audio processor component 104 can adjust a spatial widening effect that is applied to the audio signals (e.g., as perceived by the user) based at least in part on the results of the analysis (e.g., based at least in part on the respective signal strengths of the brain wave signals of the brain of the user for different frequency bands). The audio processor component 104 also can integrate a periodic or random variation on the spatial widening effect of audio signals based at least in part on the results of the analysis. In some implementations, the audio processor component 104 further can introduce a delay effect to the audio signals to generate delayed audio signals and can adjust a spatial widening effect of the delayed audio signals (e.g., as perceived by the user) based at least in part on the results of the analysis. The audio processor component 104 also can integrate a periodic or random variation on the spatial widening effect of the delayed audio signals based at least in part on the analysis results. For example, the audio processor component 104 can monitor (e.g., continuously monitor, periodically monitor, or monitor in response to an occurrence of an event) the mental state of the user via the brain waves of the user for different frequency bands and can adjust the one or more audio effects based at least in part on the respective strengths of the brain wave signals for the one or more different frequency bands.

Figure 2:
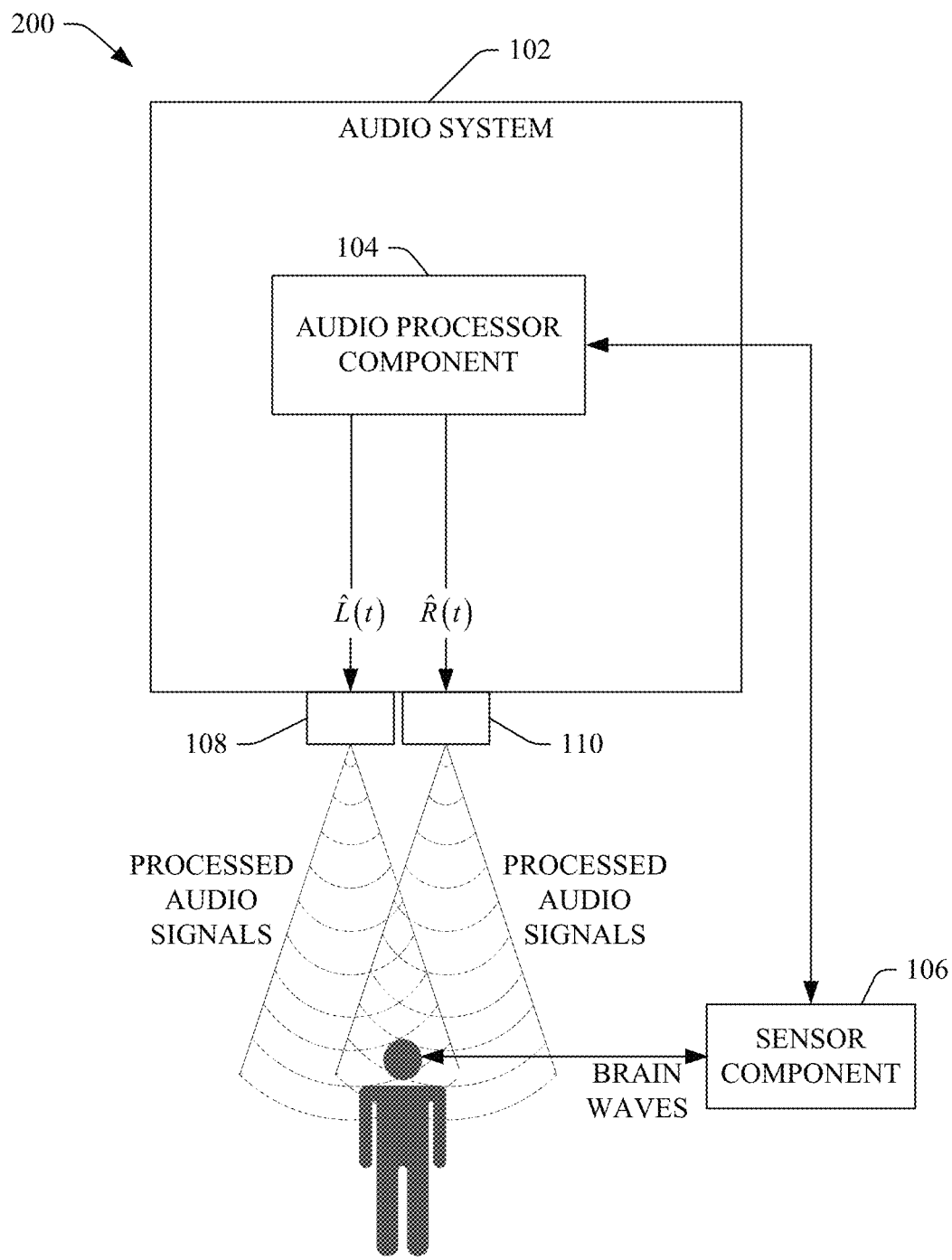
FIG. 2 depicts a diagram of an example system that can control application of one or more audio effects to audio signals of an audio presentation presented via a set of speakers to a user based at least in part on the brain wave signals of the user, in accordance with various aspects and embodiments of the disclosed subject matter.

Turning briefly to FIG. 2 (along with FIG. 1), FIG. 2 depicts a diagram of an example system 200 that can control (e.g., adaptively control) application of one or more audio effects to audio signals of an audio presentation presented via a set of speakers to a user based at least in part on the brain wave signals of the user, in accordance with various aspects and embodiments of the disclosed subject matter. In some implementations, the example system 200 can comprise the audio system 102, which can comprise the audio processor component 104, and the sensor component 106, which can be associated with the user and the audio system 102.

The audio system 102 can comprise a set of channels of audio signals, comprising a first (e.g., left) channel and a second (e.g., right) channel, that can facilitate presenting the audio signals of an audio presentation in stereo. The audio system 102 can comprise or be associated with a set of speakers (e.g., loudspeakers), comprising a first (e.g., left) speaker 108 and a second (e.g., right) speaker 110, which can be, for example, electromechanical transducers, wherein the audio processor component 104 and the set of speakers (e.g., 108, 110) can facilitate converting each channel into audible sound waves that can be heard by the user. It is to be appreciated and understood that, while this example relates to two channels and two speakers, the disclosed subject matter can apply the principles and aspects disclosed herein to three or more channels, and three or more speakers, as well.

The sensor component 106 can comprise a set of sensors that can be configured or adapted to monitor, sense, and/or capture brain wave signals (e.g., in different frequency bands) or other physical signals (e.g., facial expression, eye response, hand gestures, etc.) of the user, for example, in response to listening to an audio presentation presented by the audio system 102. The sensor component 106 can thereby capture, via an interface (e.g., interface with the user), the response of the user to the audio signals of the audio presentation from the user's brain waves as the user is listening to the audio signals.

Different frequency components of the brain wave of a user can reflect different states (e.g., mental or emotional states) of the mind of the user. For instance, the beta waves can be taken to reflect stress, and the alpha waves can be taken to reflect relaxation. The brain waves of the user (e.g., listener) can be employed to decipher the response of the user, for example, to listening to audio signals. For example, a strong beta wave can indicate violation of the expectation of the user in response to listening to the audio signals of the presentation, while a strong alpha wave can be an indication of habituation (e.g., boredom) in response to listening to the audio signals of the presentation.

The left and the right audio signals of the audio presentation can be represented by the time varying time waveforms L(t) (e.g., left time varying waveform) and R(t) (e.g., right time varying waveform), respectively. Without loss of generality, in this example implementation, only operations of the disclosed subject matter are included to modify the left and the right audio signals of the audio presentation. The result of the modification can be a new pair of audio channels that can be given by $$\hat{L}(t)=w_1L(t)-w_2R(t)+w_3L(t-T)-w_4R(t-T), \quad (1)$$

$$\text{and } \hat{R}(t)=w_5R(t)-w_6L(t)+w_7R(t-T)-w_8L(t-T), \quad (2)$$

wherein T is a constant time delay, $w_1$, $w_2$, $w_3$, $w_4$, $w_5$, $w_6$, $w_7$ and $w_8$ are variables controlling the modification of the left and the right audio signals by the audio processor component 104, $\hat{L}(t)$ is the modified left time varying waveform, and $\hat{R}(t)$ is the modified right time varying waveform. Without loss of generality, the following assignment can be used (e.g., by the audio processor component 104).

$$w_5=w_1, \quad (3)$$

$$w_6=w_2, \quad (4)$$

$$w_7=w_3, \quad (5)$$

$$\text{and } w_8=w_4. \quad (6)$$

The audio processor component 104 can control each of the variables by the magnitude of one of the brain wave frequencies of the user's brain waves. For example, the audio processor component 104 can set each of $w_1$, $w_3$, $w_5$ and $w_7$ to a value of 1, and can set or assign each rest of the variables $w_2$, $w_4$, $w_6$ and $w_8$ a value that can be normalized to the range [0,1], and can be proportional to the magnitude of the Alpha wave with respect to the user's brain waves. Such an assignment by the audio processor component 104 can invoke surprise in the user by increasing the spatial widening effect (e.g., by the audio processor component 104) in response to the user (e.g., listener) exhibiting a sign of boredom, for example, as indicated by a strong Alpha wave. In some implementations, the audio processor component 104 can process the brain waves of the user at different frequencies by low pass filtering, so that the modification of the audio signals can be exercised in a desirably smooth and natural manner. In certain implementations, the audio processor component 104 can map the magnitude of each frequency of the brain waves of the user to a new value via a time dependent, or via a time independent function, to facilitate enabling additional surprises to be introduced to the audio presentation to decrease the habituation effect experienced by the user while listening to the audio presentation, which can further enhance the listening pleasure of the user with regard to the audio presentation.

As disclosed herein, the audio processor component 104 can provide an interface with one or more manual controls to the user to facilitate enabling the user to manipulate the one or more manual controls to facilitate manual manipulation on the schematic and veridical expectations of the user with respect to the audio presentation. Also, as disclosed herein, while a user is not required to do so, a user optionally can exert control over the user's brain waves, e.g., through deliberate focusing or relaxation by the user, in order to effectuate a desired (e.g., target) modification of the audio signals by the audio processor component 104 in response to the brain waves of the user. For example, the audio processor component 104 can set or assign the variables $w_2$, $w_4$, $w_6$, and $w_8$ to be proportional to the Alpha wave with respect to the user's brain waves, the user, as a cognoscenti listener, can deliberately relax to facilitate increasing the Alpha wave with the aim of heightening the spatial widening effect applied to the audio signals.

The sensor component 106 can sense the brain waves of the user. The audio processor component 104 can receive information relating to the brain waves of the user. The audio processor component 104 can analyze the information relating to the brain waves of the user, and, based at least in part on the analysis, can detect that the Alpha wave has increased. This detected increase in the Alpha wave can thereby indicate to the audio processor component 104 that heightening of the spatial widening effect applied to the audio signals is to be performed to facilitate enhancing the listening pleasure of the user. Thus, in response to the increase in the Alpha wave, the audio processor component 104 can adjust the parameters of the spatial widening effect to facilitate heightening (e.g., increasing) the spatial widening effect and can apply this heightened widening effect to the audio signals to generate processed (e.g., modified) audio signals. The audio processor component 104 and the set of speakers (e.g., 108, 110) can facilitate converting the processed audio signals into corresponding acoustic signals that can be presented (e.g., conveyed) to the user via the set of speakers (e.g., 108, 110). Of course, the audio processor component 104 also can determine and apply the same adjustments to the spatial widening effect in response to such an increase in the Alpha wave associated with the user when such increase in the Alpha wave occurred as a result of the subconscious response of the user to the audio presentation.

The disclosed subject matter can be employed in a variety of products or for a variety of users. For example, the disclosed subject matter can be employed in a toy, as part of an audio system, as part of medical or research equipment, or in another desired product or for another desired use.

Figure 3:
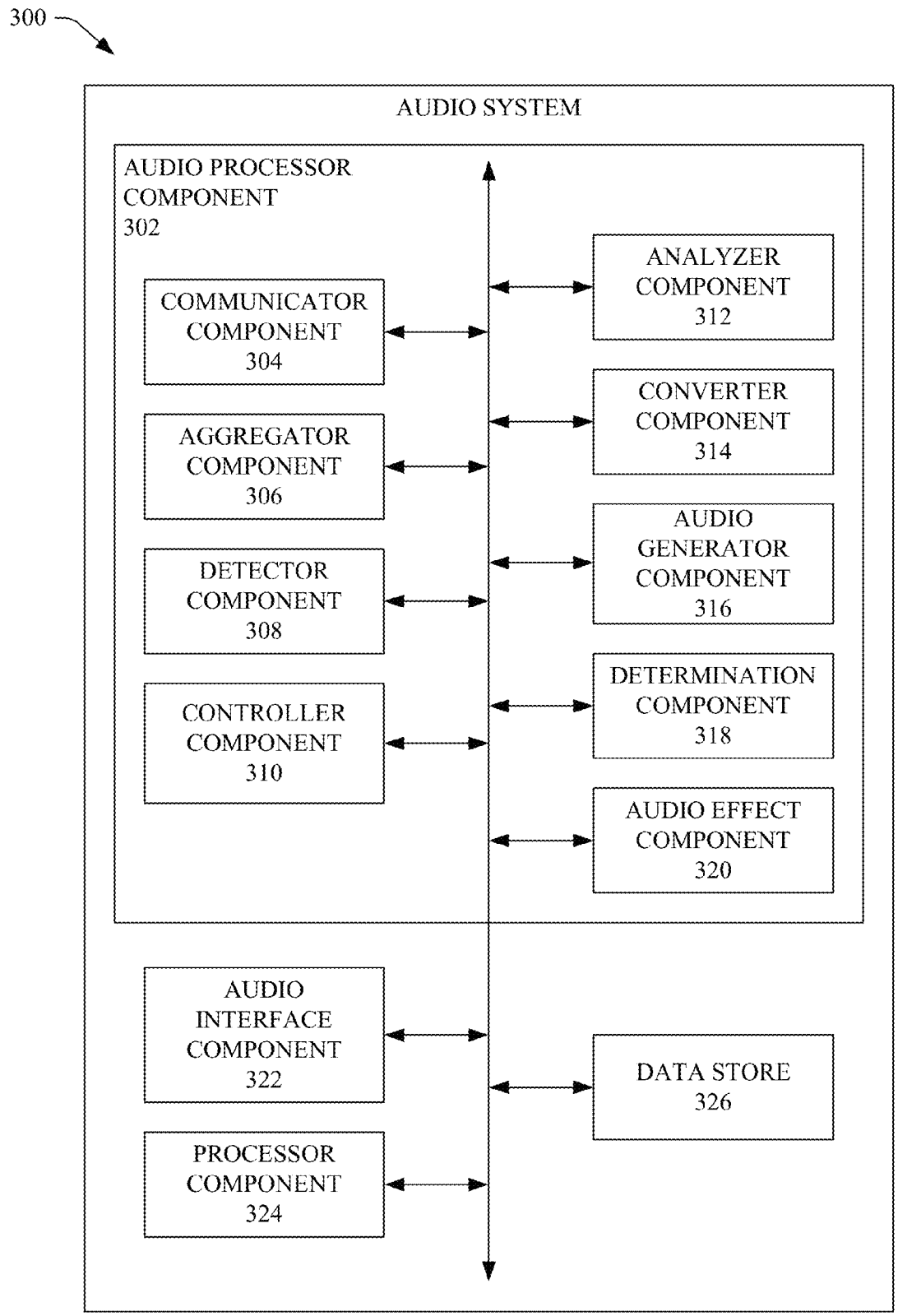
FIG. 3 illustrates a block diagram of example audio system that can control application of one or more audio effects to audio signals of an audio presentation based at least in part on the brain wave signals of a user(s), in accordance with various aspects and embodiments of the disclosed subject matter.

FIG. 3 illustrates a block diagram of an example audio system 300 that can control (e.g., adaptively control) application of one or more audio effects to audio signals of an audio presentation based at least in part on the brain wave signals of a user(s), in accordance with various aspects and embodiments of the disclosed subject matter. The audio system 300 can comprise an audio processor component 302 that can control application of the one or more audio effects to audio signals of an audio presentation based at least in part on (e.g., in response to) the brain wave signals of a user to facilitate enhancing the listening pleasure of the user as the user listens to the audio presentation. The audio processor component 302 can comprise, for example, a communicator component 304, an aggregator component 306, a detector component 308, a controller component 310, an analyzer component 312, a converter component 314, an audio generator component 316, a determination component 318, and an audio effect component 320.

The communicator component 304 can be used to communicate (e.g., transmit, receive) information between the audio system 300 and other components (e.g., sensor component(s), processor component(s), user interface(s), audio interface(s) (e.g., an audio interface(s) separate from the audio system 300), data store(s), etc.). The information can include, for example, information relating to brain wave signals of a user in response to the audio presentation, information relating to physical signals of a user in response to the audio presentation, information relating the user's response to other stimuli while experiencing the audio presentation, audio signals, user command or selection information, audio-effect related information, etc.

The aggregator component 306 can aggregate data received (e.g., obtained) from various entities (e.g., sensor component(s), processor component(s), user interface(s), audio interface(s), data store(s), etc.). The aggregator component 306 can correlate respective items of data based at least in part on type of data, source of the data, time or date the data was generated or received, audio signal with which data is associated, audio channel with which data is associated, audio effect with which data is associated, audio presentation with which data is associated, user with which data is associated, etc., to facilitate processing of the data (e.g., analyzing and other processing of the data by the controller component 310, the analyzer component 312, . . . , the audio effect component 322).

The detector component 308 can monitor and/or detect information relating to brain wave signals or physical signals sensed by the sensor component in response to the audio presentation or other stimuli. For example, as the user is listening to the audio presentation, the detector component 308 can monitor and/or detect information relating to brain wave signals that are output by the sensor component associated with the user.

The controller component 310 can control operations relating to processing information relating to the audio presentation, the audio effects, and/or the user to facilitate generation of processed (e.g., enhanced) audio signals by the audio processor component 302 that can be presented to the user to facilitate enhancing the listening pleasure of the user as the user listens to the audio presentation. The controller component 310 can facilitate controlling operations being performed by various components of the audio processor component 302, controlling data flow between various components of the audio processor component 302, controlling data flow between the audio processor component 302 and other components of the audio system 300, etc.

The analyzer component 312 can analyze data to facilitate converting information relating to brain wave signals or physical signals of a user into information representative of the brain waves, emotion, reaction, physical expression, etc., in response to the audio presentation. The analyzer component 312 also can analyze data to facilitate determining audio parameters that can be applied to an audio effect(s) and/or an audio effect(s) that can be applied to the audio signals of the audio presentation, and/or performing another process(es) on information relating to the audio presentation or the user, to facilitate enhancing the listening pleasure of the user as the user listens to the audio presentation, based at least in part on the brain wave signals of the user. The analyzer component 312 can generate analyses results based at least in part on such data analyses, wherein the data analyses can be used by another component(s) (e.g., the controller component 310, the converter component 314, . . . , the audio effect component 322) to facilitate performance of various operations of the audio processor component 302.

The converter component 314 can convert information relating to brain wave signals or physical signals of the user in response to perceiving (e.g., listening to) the audio presentation or in response to other stimuli while perceiving the audio presentation into data (e.g., data signals) that can be representative of or indicative of the brain wave signals or physical signals of the user and/or can be representative of or indicative of the mental state, emotion, and/or expression of the user in response to perceiving the audio presentation or in response to experiencing the other stimuli. The converted data (e.g., data signals) can be in a form (e.g., a data format) that can be usable by the audio processor component 302 to facilitate determining a response (e.g., a mental state, expression, reaction, or other response) of the user to the audio presentation or other stimuli, determining an audio effect(s) to apply to the audio signals, determining an adjustment to a parameter(s) for an audio effect(s) that is to be applied to the audio signals, determining a portion (e.g., a frequency range, an audio channel, etc.) of the audio signals to apply the audio effect(s) or parameter adjustment(s), and/or otherwise processing the audio signals, etc.

The audio generator component 316 can facilitate generating audio signals from an originating audio source (e.g., audio data from a data store, audio data from a compact disc or digital video disc, etc.) and/or processed audio signals derived from the originating audio source. For example, the audio generator component 316 can facilitate obtaining, receiving, or identifying audio signals from an originating audio source, and the audio generator component 316 can facilitate generating processed (e.g., enhanced) audio signals that can be based at least in part on the original audio signals and the information relating to the brain wave signals of the user.

The determination component 318 can perform determinations, measurements, and/or calculations on data (e.g., information relating to brain wave signals, physical signals, other stimuli, audio signals, etc.) to facilitate determining signal strengths of brain wave signals in different bands, determining audio parameters that can be applied to an audio effect(s) and/or an audio effect(s) that can be applied to the audio signals of the audio presentation, and/or performing another process(es) on information relating to the audio presentation or the user, to facilitate enhancing the listening pleasure of the user as the user listens to the audio presentation, based at least in part on the brain wave signals of the user.

The audio effect component 320 can comprise the one or more audio effects that can be applied to the audio signals to facilitate enhancing the audio signals for presentation to the user. The one or more audio effects can comprise, for example, a spatial or 3-D effect (e.g., a spatial widening effect), an audio delay effect, a panning or channel mixing effect, an equalization or filtering effect, a reverb effect, and/ or one or more other audio effects that can be employed to facilitate enhancing the audio signals of the audio presentation to facilitate enhancing the listening pleasure of the user while listening to the audio presentation.

In some implementations, the audio system 300 can comprise or be associated with an audio interface component 322 that can comprise or be associated with (e.g., communicatively connected to or interfaced with) a set of speakers that can be employed to present (e.g., broadcast, emit, project, etc.) audio signals (e.g., original or enhanced audio signals) to a user. The set of speakers can comprise two or more speakers. In some implementations, the set of speakers can be part of a set of loudspeakers, headphones, or earbuds.

The audio system 300 also can comprise a processor component 324 that can operate in conjunction with the other components (e.g., audio processor component 302, audio interface component 322, etc.) to facilitate performing the various functions of the audio system 300. The processor component 324 can employ one or more processors (e.g., central processing units (CPUs), graphics processing units (GPUs), field programmable gate arrays (FPGAs), etc.), microprocessors, or controllers that can process data, such as information relating to brain waves of a user, physical actions of a user, audio signals, audio effects, parameters or coefficients relating to one or more audio effects, etc., to facilitate determining an audio effect to use in connection with an audio presentation, determining an audio effect parameter to use for an audio effect, otherwise processing (e.g., enhancing) audio signals, or performing other operations relating to processing audio signals; and can control data flow between the audio system 300 and other components associated with the audio system 300.

In yet another aspect, the audio system 300 can contain a data store 326 that can store data structures (e.g., user data, metadata); code structure(s) (e.g., modules, objects, classes, procedures), commands, or instructions; information relating to brain waves of a user, physical actions of a user, audio signals, audio effects, parameters or coefficients relating to one or more audio effects, etc.; algorithms (e.g., algorithm(s) that can facilitate converting sensed information relating to brain waves of a user to information indicative of the response or mental state of the user in response to an audio presentation, an audio processing algorithm(s) or audio effect algorithm(s), etc.); and so on. In an aspect, the processor component 324 can be functionally coupled (e.g., through a memory bus) to the data store 326 in order to store and retrieve information desired to operate and/or confer functionality, at least in part, to the audio processor component 302, audio interface component 322, etc., and/or substantially any other operational aspects of the audio system 300. It is to be appreciated and understood that the various components of the audio system 300 can communicate information between each other and/or between other components associated with the audio system 300 as desired to carry out operations of the audio system 300. It is to be further appreciated and understood that respective components (e.g., audio processor component 302, audio interface component 322, etc.) of the audio system 300 each can be a stand-alone unit, can be included within the audio system 300 (as depicted), can be incorporated within another component of the audio system 300 or a component separate from the audio system 300, and/or virtually any suitable combination thereof, as desired.

Figure 4:
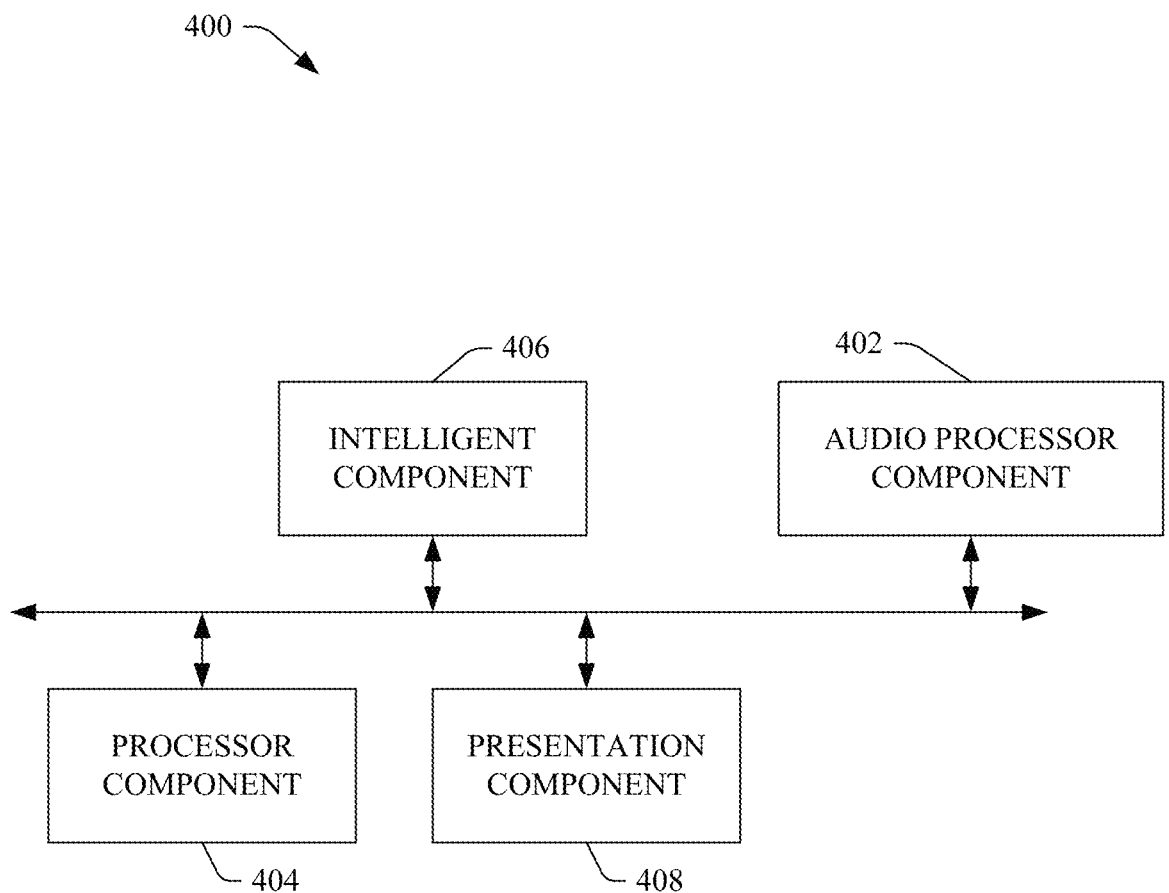
FIG. 4 depicts a system that can employ intelligence to facilitate controlling (e.g., adaptively controlling) application of one or more audio effects to audio signals of an audio presentation based at least in part on the brain wave signals of a user(s), in accordance with various aspects and embodiments of the disclosed subject matter.

Referring to FIG. 4, depicted is a block diagram of a system 400 that can employ intelligence to facilitate controlling (e.g., adaptively controlling) application of one or more audio effects to audio signals of an audio presentation based at least in part on the brain wave signals of a user(s), in accordance with various aspects and embodiments of the disclosed subject matter. The system 400 can include an audio processor component 402 that can desirably control application of one or more audio effects to audio signals of an audio presentation presented by an audio system (not shown in FIG. 4) based at least in part on the brain wave signals of a user(s), as more fully disclosed herein. It is to be appreciated that the audio processor component 402 can be the same or similar as respective components (e.g., respectively named components), and/or can contain the same or similar functionality as respective components, as more fully described herein. The audio processor component 402 can be associated with (e.g., communicatively connected to) a sensor component (not shown in FIG. 4) that can be associated with a user to facilitate sensing brain wave signals of the user, for example, in response to perceiving (e.g. listening to) the audio presentation provided by the audio system, as more fully described herein.

The system 400 can further include a processor component 404 that can be associated with (e.g., communicatively connected to) the audio processor component 402 and/or other components (e.g., components of system 400) via a bus. In accordance with an embodiment of the disclosed subject matter, the processor component 404 can be an applications processor(s) that can manage communications and run applications. For example, the processor component 404 can be a processor that can be utilized by a computer, mobile computing device, personal data assistant (PDA), or other electronic computing device. The processor component 404 can generate, communicate, and/or execute commands in order to facilitate analyzing information relating to brain wave signals or physical signals (e.g., facial expressions, eye response, hand or finger gestures, etc.) of a user (e.g., listener), detecting respective strengths of brain wave signals of a user (e.g., listener), determining which audio effect(s) to apply or adjust to facilitate desirably (e.g., suitably) processing the audio signals, determining adjustments to make to parameters or controls of the one or more audio effects to facilitate adjusting the application of the one or more audio effects to the audio signals of the audio presentation, processing the audio signals to generate the processed audio signals, etc.

The system 400 also can include an intelligent component 406 that can be associated with (e.g., communicatively connected to) the audio processor component 402, the processor component 404, and/or other components associated with system 400 to facilitate analyzing data, such as current and/or historical information, and, based at least in part on such information, can make an inference(s) and/or a determination(s) regarding, for example, respective strengths of brain wave signals of the user, which audio effect(s) to apply or adjust to facilitate desirably processing the audio signals, adjustments to make to parameters or controls of the one or more audio effects to facilitate adjusting the application of the one or more audio effects to the audio signals of the audio presentation, how the audio signals are to be processed to generate the processed audio signals, etc.

For example, based in part on current and/or historical evidence, the intelligent component 406 can infer or determine a signal strength of a brain wave signal of the user in a particular frequency band, which audio effect(s) to apply or adjust to facilitate desirably processing the audio signals, an adjustment to make to a parameter or control of the one or more audio effects to facilitate adjusting the application of the one or more audio effects to the audio signals of the audio presentation, a process(es) to apply to the audio signals to facilitate generating the processed audio signals, etc.

In an aspect, the intelligent component 406 can communicate information related to the inferences and/or determinations to the audio processor component 402. Based at least in part on the inference(s) or determination(s) made by the intelligent component 406, the audio processor component 402 can take (e.g., automatically or dynamically take) one or more actions to facilitate desirably processing the audio signals to generate processed audio signals that can enhance the listening pleasure of the user as the user listens to the audio presentation. For instance, the audio processor component 402 can determine or identify a signal strength of a brain wave signal of the user for a particular frequency band, an audio effect(s) to apply or adjust to facilitate desirably processing the audio signals, an adjustment to make to a parameter or control of the one or more audio effects to facilitate adjusting the application of the one or more audio effects to the audio signals of the audio presentation, a process(es) to apply to the audio signals to facilitate generating the processed audio signals, as disclosed herein.

It is to be understood that the intelligent component 406 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

System 400 also can include a presentation component 408, which can be connected with the processor component 404. The presentation component 408 can provide various types of user interfaces to facilitate interaction between a user and any component coupled to the processor component 404. As depicted, the presentation component 408 is a separate entity that can be utilized with the processor component 404 and associated components. However, it is to be appreciated that the presentation component 408 and/or similar view components can be incorporated into the processor component 404 and/or can be a stand-alone unit. The presentation component 408 can provide one or more graphical user interfaces (GUIs) (e.g., touchscreen GUI), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the processor component 404.

The user can also interact with the regions to select and provide information via various devices such as a mouse, a roller ball, a keypad, a keyboard, a touchscreen, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

In accordance with one embodiment of the disclosed subject matter, the audio processor component 402 and/or other components, can be situated or implemented on a single integrated-circuit chip. In accordance with another embodiment, the audio processor component 402, and/or other components, can be implemented on an application-specific integrated-circuit (ASIC) chip. In yet another embodiment, the audio processor component 402 and/or other components, can be situated or implemented on multiple dies or chips.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 5:
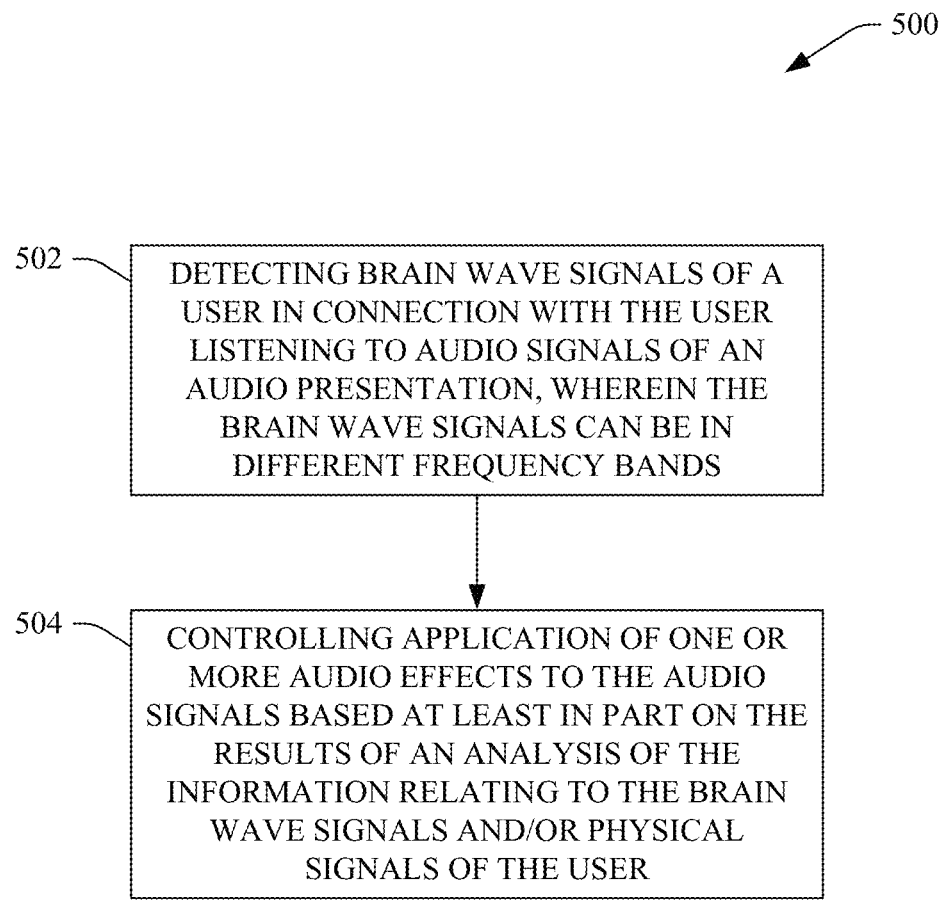
FIG. 5 illustrates a flow diagram of an example method that can control application of one or more audio effects to audio signals of an audio presentation presented by an audio system based at least in part on the brain wave signals of a user(s), in accordance with various aspects and embodiments of the disclosed subject matter.
Figure 6:
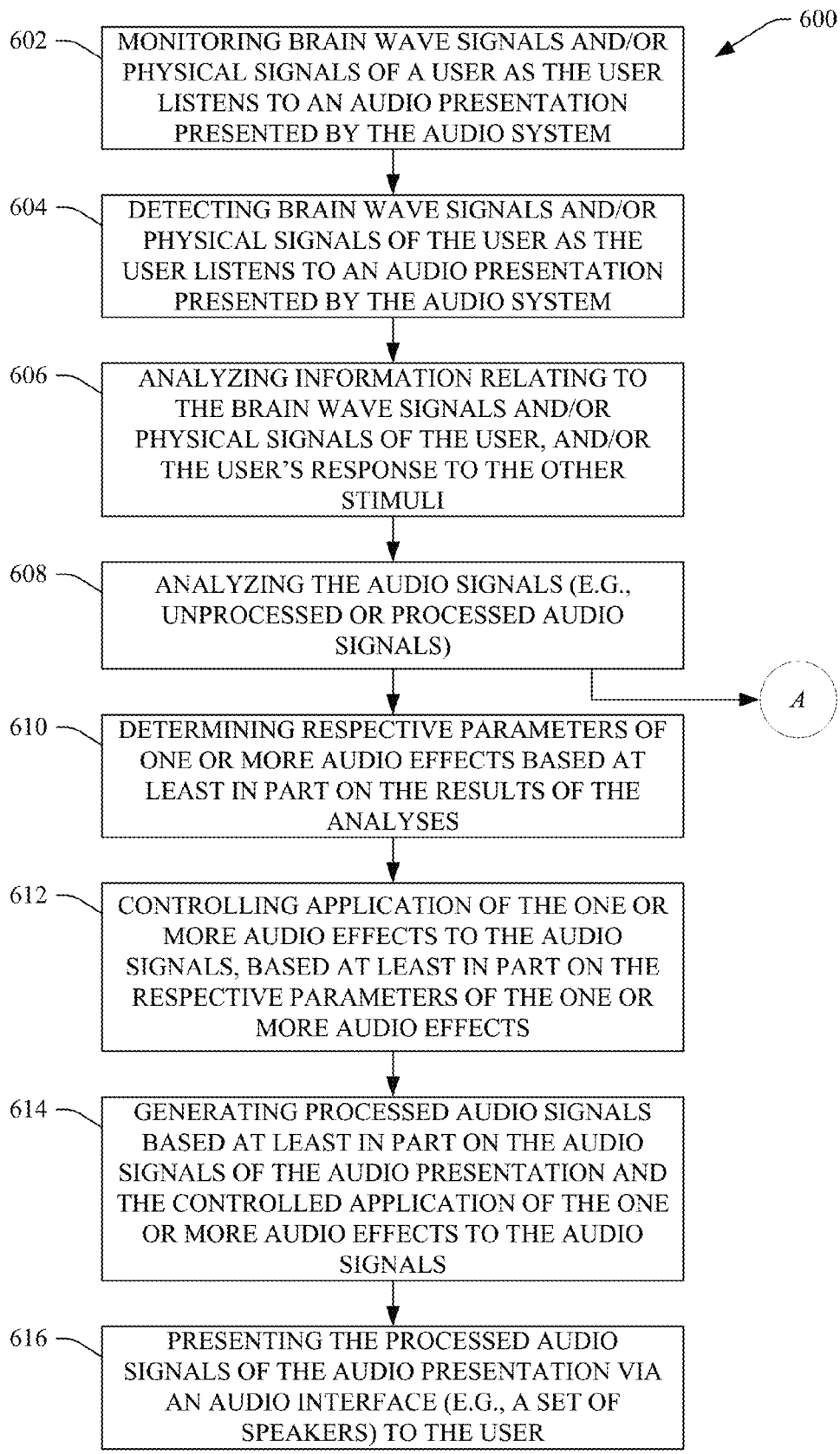
FIG. 6 depicts a flow diagram of another example method that can control application of one or more audio effects to audio signals of an audio presentation presented by an audio system based at least in part on the brain wave signals of a user(s), in accordance with various aspects and embodiments of the disclosed subject matter.
Figure 7:
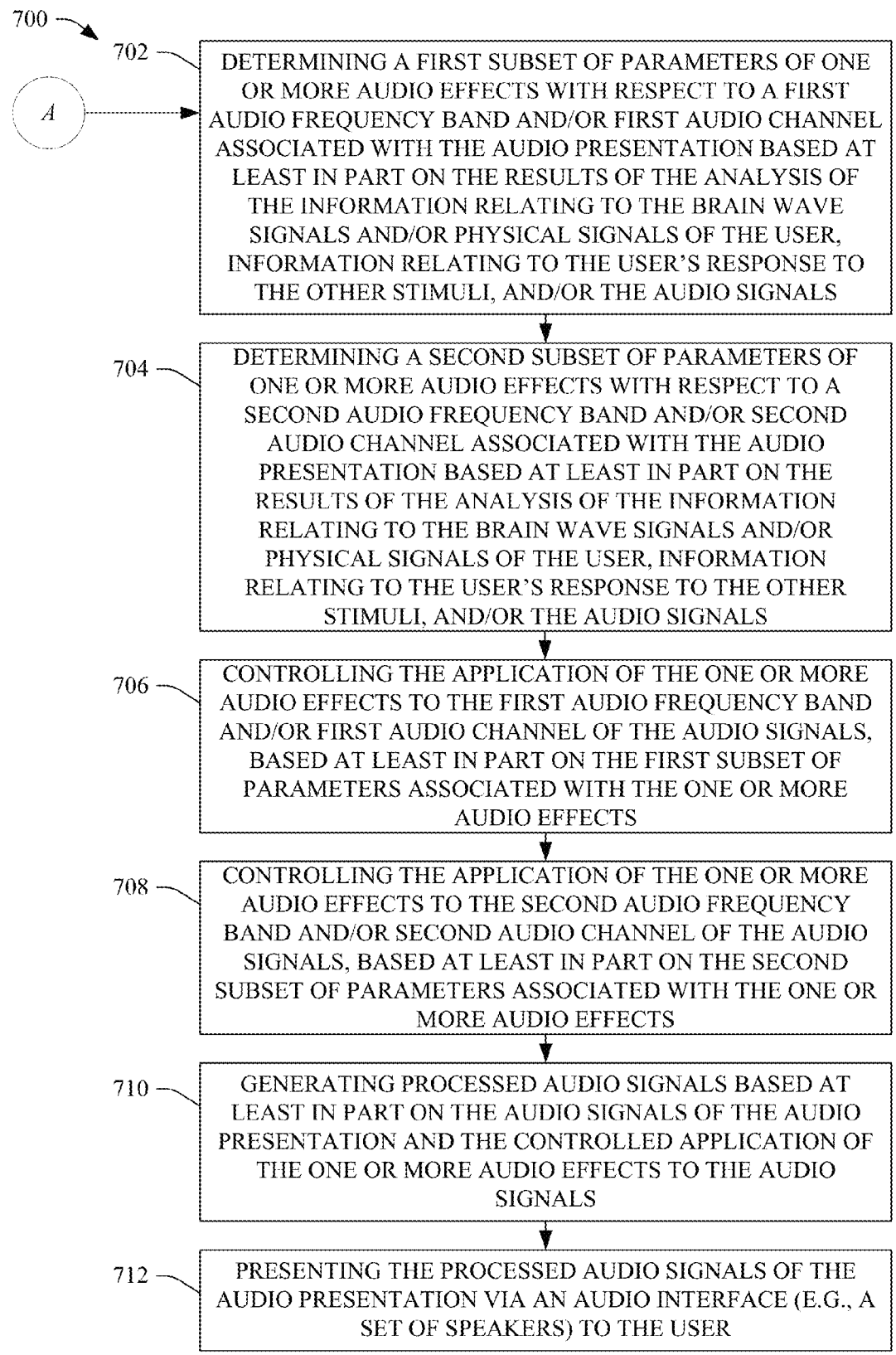
FIG. 7 presents a flow diagram of an example method that can control application of one or more audio effects to respective audio frequency bands and/or respective audio channels of audio signals of an audio presentation presented by an audio system based at least in part on the brain wave signals of a user(s), in accordance with various aspects and embodiments of the disclosed subject matter.

FIGS. 5-7 illustrate methods and/or flow diagrams in accordance with the disclosed subject matter. For simplicity of explanation, the methods are depicted and described as a series of acts. It is to be understood and appreciated that the subject disclosure is not limited by the acts illustrated and/or by the order of acts, for example acts can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events. Additionally, it should be further appreciated that the methods disclosed hereinafter and throughout this specification are capable of being stored on an article of manufacture to facilitate transporting and transferring such methods to computers. The term article of manufacture, as used herein, is intended to encompass a computer program accessible from any computer-readable device, carrier, or media.

Referring to FIG. 5, illustrated is a flow diagram of an example method 500 that can control (e.g., adaptively control) application of one or more audio effects to audio signals of an audio presentation presented by an audio system based at least in part on the brain wave signals of a user(s), in accordance with various aspects and embodiments of the disclosed subject matter. The method 500 can be implemented by an audio processor component that can be associated with an audio system and a sensor component, as more fully described herein.

At 502, brain wave signals of a user can be detected in connection with the user listening to audio signals of an audio presentation, wherein the brain wave signals can be in different frequency bands. As the user is listening to the audio presentation presented by the audio system, the sensor component can sense brain wave signals, which can represent brain activity or responses of the brain of the user, and/or physical signals of the user, in response to listening to the audio presentation. The audio processor component can receive (e.g., in real or near real time) information relating to the brain wave signals and/or physical signals of the user from the sensor component. The audio processor component can detect or determine (e.g., in real or near real time) the brain wave signals (e.g., detect or determine Alpha wave values and/or Beta wave values of the brain wave signals) based at least in part on analysis results obtained from an analysis of the information relating to the brain wave signals by the audio processor component.

At 504, application of one or more audio effects to the audio signals can be controlled (e.g., adaptively controlled, in real or near real time) based at least in part on the results of an analysis of the information relating to the brain wave signals and/or physical signals of the user. The audio processor component can analyze the information relating to the brain wave signals and/or physical signals of the user. Based at least in part on the analysis, the audio processor component can determine (e.g., automatically or dynamically determine, in real or near real time) one or more audio effects to apply to the audio signals or one or more adjustments to make to an audio effect(s) that is being applied to the audio signals to facilitate desirably processing the audio signals to generate processed audio signals for presentation to the user by the audio system to facilitate enhancing the listening pleasure of the user as the user listens to the audio presentation. The audio processor component can (e.g., automatically or dynamically, in real or near real time) apply the one or more audio effects and/or adjust (e.g., adjust the parameters of) the one or more audio effects to facilitate processing the audio signals to generate the processed audio signals for presentation to the user by the audio system. The audio processor component can continue to monitor the feedback from the user (e.g., brain wave signals or physical signals of the user) in response to listening to the audio signals (e.g., processed audio signals) of the audio presentation or other stimuli experienced by the user as the user listens to the audio presentation, and can continue to control the application of the one or more audio effects to the audio signals based at least in part on an analysis of the feedback from the user.

Turning to FIG. 6, depicted is a flow diagram of another example method 600 that can control (e.g., adaptively control) application of one or more audio effects to audio signals of an audio presentation presented by an audio system based at least in part on the brain wave signals of a user(s), in accordance with various aspects and embodiments of the disclosed subject matter. The method 600 can be implemented by an audio processor component that can be associated with an audio system and a sensor component, as more fully described herein.

At 602, brain wave signals and/or physical signals of a user can be monitored as the user listens to an audio presentation presented by the audio system. At 604, brain wave signals and/or physical signals of the user can be detected (e.g., in real or near real time) as the user listens to an audio presentation presented by the audio system. The sensor component can sense or detect brain wave signals, which can represent the brain activity or response of the user, and/or physical signals of the user, in response to listening to the audio presentation, and/or can sense or detect the user's response to other stimuli as the user is listening to the audio presentation. The audio processor component can monitor the brain wave signals and/or physical signals of a user as the user listens to an audio presentation presented by the audio system, and can detect or receive (e.g., in real or near real time) information relating to the brain wave signals and/or physical signals of the user, and/or the user's response to the other stimuli, from the sensor component.

At 606, the information relating to the brain wave signals and/or physical signals of the user, and/or the user's response to the other stimuli, can be analyzed. The audio processor component can analyze the information relating to the brain wave signals and/or physical signals of the user, and/or the user's response to the other stimuli, and generate analysis results that can facilitate controlling the application of the one or more audio effects to the audio signals of the audio presentation to facilitate enhancing the user's listening experience.

At 608, the audio signals (e.g., unprocessed or processed audio signals) can be analyzed. In connection with the analysis the information relating to the brain wave signals and/or physical signals of the user, and/or the user's response to the other stimuli, the audio processor component also can analyze the audio signals of the audio presentation to facilitate generating the analysis results that can be used to facilitate controlling the application of the one or more audio effects to the audio signals of the audio presentation to facilitate enhancing the user's listening experience. In some implementations, the method 600 can proceed to reference point A, wherein another method, such as method 700 associated with FIG. 7, can proceed from reference point A.

At 610, respective parameters (e.g., audio effect parameters) of one or more audio effects can be determined based at least in part on the results of the analysis of the information relating to the brain wave signals and/or physical signals of the user, information relating to the user's response to the other stimuli, and/or the audio signals. The audio processor component can determine the respective parameters of the one or more audio effects based at least on part on such analyses results.

At 612, the application of the one or more audio effects to the audio signals can be controlled, based at least in part on the respective parameters of the one or more audio effects, to facilitate enhancing the listening pleasure of the user in accordance with the brain wave signals of the user. The audio processor component can control (e.g., set, adjust, modify, etc.) the application of the one or more audio effects to the audio signals based at least in part on the respective parameters of the one or more audio effects. For instance, the audio processor component can facilitate setting, adjusting, modifying, or controlling the respective audio parameters for the one or more audio effects to facilitate controlling the application of the one or more audio effects to the audio signals.

At 614, processed audio signals can be generated based at least in part on the audio signals of the audio presentation and the controlled application of the one or more audio effects to the audio signals. The audio processor component can facilitate processing the audio signals via the controlled application of the one or more audio effects to generate the processed audio signals.

At 616, the processed audio signals of the audio presentation can be presented via an audio interface (e.g., a set of speakers) to the user. The audio processor component can be associated with the audio interface, which can be a set of two or more speakers. The audio processor component can communicate the processed audio signals to the audio interface for presentation (e.g., communication, broadcast, etc.) to the user to facilitate presenting an enhanced audio presentation to the user to enhance the listening pleasure of the user as the user listens to the audio presentation (e.g., enhanced audio presentation).

FIG. 7 presents a flow diagram of an example method 700 that can control (e.g., adaptively control) application of one or more audio effects to respective audio frequency bands and/or respective audio channels of audio signals of an audio presentation presented by an audio system based at least in part on the brain wave signals of a user(s), in accordance with various aspects and embodiments of the disclosed subject matter. The method 700 can be implemented by an audio processor component that can be associated with an audio system and a sensor component, as more fully described herein. In some implementations, the method 700 can proceed from reference point A associated with FIG. 6.

At 702, a first subset of parameters (e.g., a first subset of audio effect parameters) of one or more audio effects can be determined with respect to a first audio frequency band and/or a first audio channel associated with the audio presentation based at least in part on the results of the analysis of the information relating to the brain wave signals and/or physical signals of the user, information relating to the user's response to the other stimuli, and/or the audio signals. The audio processor component can determine the first subset of parameters of the one or more audio effects for the first audio frequency band (e.g., a first range of audio frequencies) and/or the first audio channel of the audio presentation based at least on part on such analyses results.

At 704, a second subset of parameters (e.g., a second subset of audio effect parameters) of one or more audio effects can be determined with respect to a second audio frequency band and/or a second audio channel associated with the audio presentation based at least in part on the results of the analysis of the information relating to the brain wave signals and/or physical signals of the user, information relating to the user's response to the other stimuli, and/or the audio signals. The audio processor component can determine the second subset of parameters of the one or more audio effects for the second audio frequency band and/or the second audio channel of the audio presentation based at least on part on such analyses results. The first audio frequency band can be a lower range of audio frequencies and the second audio frequency band can be a higher range of audio frequencies, for example.

At 706, the application of the one or more audio effects to the first audio frequency band and/or to the first audio channel of the audio signals can be controlled, based at least in part on the first subset of parameters associated with the one or more audio effects, to facilitate enhancing the listening pleasure of the user in accordance with the brain wave signals of the user. The audio processor component can control (e.g., set, adjust, modify, etc.) the application of the one or more audio effects to the first audio frequency band and/or to the first audio channel of the audio signals based at least in part on the first subset of audio effect parameters. For instance, the audio processor component can facilitate setting, adjusting, modifying, or controlling the respective audio parameters for the one or more audio effects, based at least in part on the first subset of parameters, to facilitate controlling the application of the one or more audio effects to the first audio frequency band and/or to the first audio channel of the audio signals.

At 708, the application of the one or more audio effects to the second audio frequency band and/or to the second audio channel of the audio signals can be controlled, based at least in part on the second subset of parameters associated with the one or more audio effects, to facilitate enhancing the listening pleasure of the user in accordance with the brain wave signals of the user. The audio processor component can control (e.g., set, adjust, modify, etc.) the application of the one or more audio effects to the second audio frequency band and/or to the second audio channel of the audio signals based at least in part on the second subset of audio effect parameters. For instance, the audio processor component can facilitate setting, adjusting, modifying, or controlling the respective audio parameters for the one or more audio effects, based at least in part on the second subset of parameters, to facilitate controlling the application of the one or more audio effects to the second audio frequency band and/or to the second audio channel of the audio signals.

At 710, processed audio signals can be generated based at least in part on the audio signals of the audio presentation and the controlled application of the one or more audio effects to the audio signals based at least in part on the first subset of parameters in connection with the first audio frequency band and/or to the second audio channel and the second subset of parameters in connection with the second audio frequency band and/or to the second audio channel. The audio processor component can facilitate processing the audio signals via the controlled application of the one or more audio effects to generate the processed audio signals.

At 712, the processed audio signals of the audio presentation can be presented via an audio interface (e.g., a set of speakers) to the user. The audio processor component can be associated with the audio interface, which can be a set of two or more speakers. The audio processor component can communicate the processed audio signals to the audio interface for presentation to the user to facilitate presenting an enhanced audio presentation to the user to enhance the listening pleasure of the user.

Figure 8:
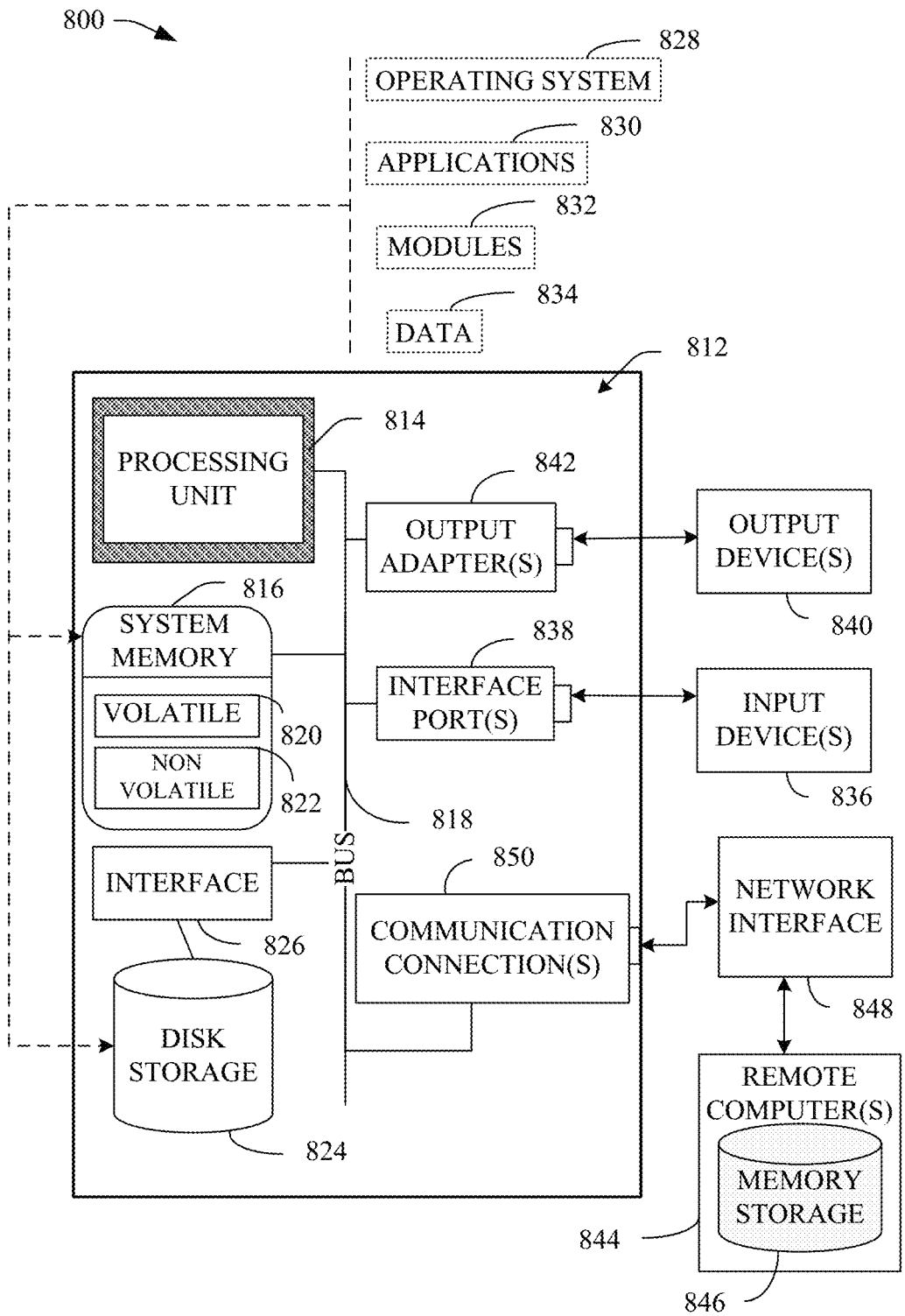
FIG. 8 is a schematic block diagram illustrating a suitable operating environment.
Figure 9:
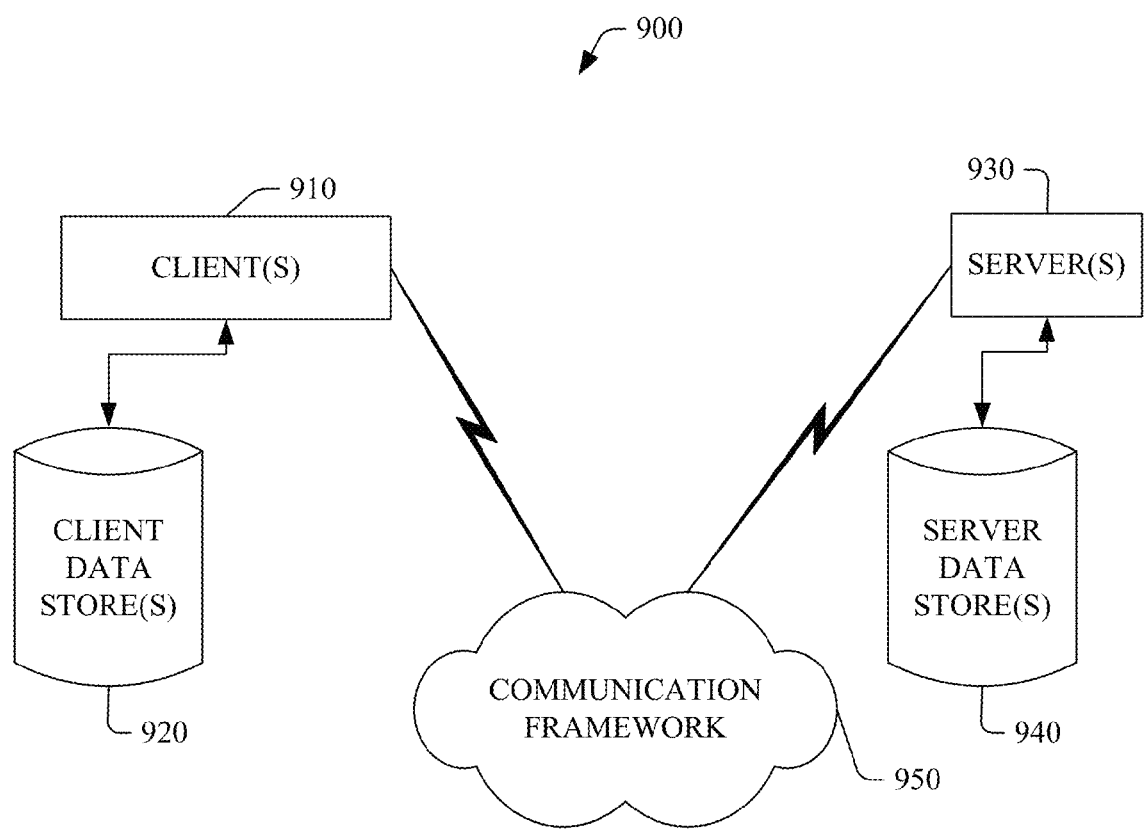
FIG. 9 is a schematic block diagram of a sample-computing environment.

In order to provide a context for the various aspects of the disclosed subject matter, FIGS. 8 and 9 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject disclosure also may be implemented in combination with other program modules. Generally, program modules include routines, programs, components, data structures, etc. that perform particular tasks and/or implement particular abstract data types. Moreover, those skilled in the art will appreciate that the methods may be practiced with other computer system configurations, including single-processor or multiprocessor computer systems, mini-computing devices, mainframe computers, as well as personal computers, hand-held computing devices (e.g., personal digital assistant (PDA), phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject disclosure can be practiced on stand-alone computers. In a distributed computing environment, program modules may be located in both local and remote memory storage devices.

With reference to FIG. 8, a suitable environment 800 for implementing various aspects of the claimed subject matter includes a computer 812. The computer 812 includes a processing unit 814, a system memory 816, and a system bus 818. It is to be appreciated that the computer 812 can be used in connection with implementing one or more of the systems or components (e.g., audio processor component, audio system, sensor component, processor component, data store, etc.) shown and/or described in connection with, for example, FIGS. 1-7. The system bus 818 couples system components including, but not limited to, the system memory 816 to the processing unit 814. The processing unit 814 can be any of various available processors. Dual microprocessors and other multiprocessor architectures also can be employed as the processing unit 814.

The system bus 818 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 816 includes volatile memory 820 and nonvolatile memory 822. The basic input/output system (BIOS), containing the basic routines to transfer information between elements within the computer 812, such as during start-up, is stored in nonvolatile memory 822. By way of illustration, and not limitation, nonvolatile memory 822 can include read only memory (ROM), programmable ROM (PROM), electrically programmable ROM (EPROM), electrically erasable programmable ROM (EEPROM), or flash memory. Volatile memory 820 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 812 also can include removable/non-removable, volatile/non-volatile computer storage media. FIG. 8 illustrates, for example, a disk storage 824. Disk storage 824 includes, but is not limited to, devices like a magnetic disk drive, floppy disk drive, tape drive, Jaz drive, Zip drive, LS-100 drive, flash memory card, or memory stick. In addition, disk storage 824 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 824 to the system bus 818, a removable or non-removable interface is typically used, such as interface 826).

It is to be appreciated that FIG. 8 describes software that acts as an intermediary between users and the basic computer resources described in the suitable operating environment 800. Such software includes an operating system 828. Operating system 828, which can be stored on disk storage 824, acts to control and allocate resources of the computer system 812. System applications 830 take advantage of the management of resources by operating system 828 through program modules 832 and program data 834 stored either in system memory 816 or on disk storage 824. It is to be appreciated that the claimed subject matter can be implemented with various operating systems or combinations of operating systems.

A user enters commands or information into the computer 812 through input device(s) 836. Input devices 836 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 814 through the system bus 818 via interface port(s) 838. Interface port(s) 838 include, for example, a serial port, a parallel port, a game port, and a universal serial bus (USB). Output device(s) 840 use some of the same type of ports as input device(s) 836. Thus, for example, a USB port may be used to provide input to computer 812, and to output information from computer 812 to an output device 840. Output adapter 842 is provided to illustrate that there are some output devices 840 like monitors, speakers, and printers, among other output devices 840, which require special adapters. The output adapters 842 include, by way of illustration and not limitation, video and sound cards that provide a means of connection between the output device 840 and the system bus 818. It should be noted that other devices and/or systems of devices provide both input and output capabilities such as remote computer(s) 844.

Computer 812 can operate in a networked environment using logical connections to one or more remote computers, such as remote computer(s) 844. The remote computer(s) 844 can be a personal computer, a server, a router, a network PC, a workstation, a microprocessor based appliance, a peer device or other common network node and the like, and typically includes many or all of the elements described relative to computer 812. For purposes of brevity, only a memory storage device 846 is illustrated with remote computer(s) 844. Remote computer(s) 844 is logically connected to computer 812 through a network interface 848 and then physically connected via communication connection 850. Network interface 848 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 850 refers to the hardware/software employed to connect the network interface 848 to the bus 818. While communication connection 850 is shown for illustrative clarity inside computer 812, it can also be external to computer 812. The hardware/software necessary for connection to the network interface 848 includes, for exemplary purposes only, internal and external technologies such as, modems including regular telephone grade modems, cable modems and DSL modems, ISDN adapters, and Ethernet cards.

FIG. 9 is a schematic block diagram of a sample-computing environment 900 with which the subject disclosure can interact. The system 900 includes one or more client(s) 910. The client(s) 910 can be hardware and/or software (e.g., threads, processes, computing devices). The system 900 also includes one or more server(s) 930. Thus, system 900 can correspond to a two-tier client server model or a multi-tier model (e.g., client, middle tier server, data server), amongst other models. The server(s) 930 can also be hardware and/or software (e.g., threads, processes, computing devices). The servers 930 can house threads to perform transformations by employing the subject disclosure, for example. One possible communication between a client 910 and a server 930 may be in the form of a data packet transmitted between two or more computer processes.

The system 900 includes a communication framework 950 that can be employed to facilitate communications between the client(s) 910 and the server(s) 930. The client(s) 910 are operatively connected to one or more client data store(s) 920 that can be employed to store information local to the client(s)

910. Similarly, the server(s) 930 are operatively connected to one or more server data store(s) 940 that can be employed to store information local to the servers 930.

It is to be appreciated and understood that components (e.g., audio processor component, audio system, audio interface or speakers, sensor component, processor component, data store, etc.), as described with regard to a particular system or method, can include the same or similar functionality as respective components (e.g., respectively named components or similarly named components) as described with regard to other systems or methods disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As utilized herein, terms "component," "system," and the like, can refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein can encompass a computer program accessible from any computer-readable device, carrier, or media. For example, computer readable media can include, but is not limited to, magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). As used and defined herein, the term "computer-readable storage device" excludes transitory storage media. Of course, those skilled in the art will recognize many modifications can be made to this configuration without departing from the scope or spirit of the disclosed subject matter.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a graphics processing unit (GPU), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor may also be implemented as a combination of computing processing units.

In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM)). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or methods herein are intended to include, without being limited to including, these and any other suitable types of memory.

Some portions of the detailed description have been presented in terms of algorithms and/or symbolic representations of operations on data bits within a computer memory. These algorithmic descriptions and/or representations are the means employed by those cognizant in the art to effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

What has been described above includes examples of aspects of the disclosed subject matter. It is, of course, not possible to describe every conceivable combination of components or methods for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system, comprising:
    at least one memory that stores executable components; and
    at least one processor that executes or facilitates execution of the executable components, comprising:
        a detector component that detects a set of signals associated with brain activity of a brain of a user, wherein the set of signals comprises at least a first signal associated with a first frequency band and a second signal associated with a second frequency band; and
        an audio processor component that controls application of one or more audio effects to audio signals generated by an audio device, based at least in part on a result of an analysis of the set of signals that indicates a first signal strength of the first signal associated with the first frequency band and a second signal strength of the second signal associated with the second frequency band, to generate processed audio signals for presentation to the user.

2. The system of claim 1, wherein the audio processor component analyzes the set of signals and the audio signals to facilitate determining a set of effect parameters relating to the one or more audio effects.

3. The system of claim 2, wherein the audio processor component determines the set of effect parameters based at least in part on the result of the analysis of the set of signals and another result of the analysis of the audio signals.

4. The system of claim 3, wherein the audio processor component applies the set of effect parameters to the one or more audio effects to facilitate the control of the application of the one or more audio effects to the audio signals.

5. The system of claim 2, wherein the audio processor component determines respective signal strengths of respective signals of the set of signals based at least in part on the result of the analysis of the set of signals, and wherein the respective signal strengths comprise the first signal strength and the second signal strength.

6. The system of claim 5, wherein the audio signals are multiple-channel audio signals associated with at least a first audio channel and a second audio channel.

7. The system of claim 6, wherein the one or more audio effects comprise a spatial effect, and wherein the audio processor component adjusts a spatial dimension of the spatial effect applied to the multiple-channel audio signals based at least in part on the respective signal strengths of the respective signals of the set of signals.

8. The system of claim 7, wherein the adjustment of the spatial dimension of the spatial effect comprises adjustment of a widening of the spatial effect applied to the multiple-channel audio signals, and wherein the audio processor component integrates at least one of a periodic adjustment or a random adjustment of the widening of the spatial effect applied to the multiple-channel audio signals.

9. The system of claim 7, wherein the audio processor component applies a delay effect to the multiple-channel audio signals to generate delayed multiple-channel audio signals, and the adjustment of the spatial dimension of the spatial effect comprises adjustment of a widening of the spatial effect applied to the delayed multiple-channel audio signals, and wherein the audio processor component integrates at least one of a periodic adjustment or a random adjustment of the widening of the spatial effect applied to the delayed multiple-channel audio signals.

10. The system of claim 2, wherein the first signal associated with the first frequency band is determined to have the first signal strength, and the second signal associated with the second frequency band is determined to have the second signal strength, and wherein the audio processor component determines a first effect parameter of the set of effect parameters based at least in part on the first signal strength associated with the first frequency band, and determines a second effect parameter of the set of effect parameters based at least in part on the second signal strength associated with the second frequency band.

11. The system of claim 10, wherein the audio processor component applies the first effect parameter and the second effect parameter to at least one audio effect of the one or more audio effects to facilitate controlling application of the at least one audio effect to the audio signals.

12. The system of claim 10, wherein the audio processor component applies the first effect parameter to at least one audio effect of the one or more audio effects to facilitate controlling application of the at least one audio effect to a first audio frequency band of the audio signals, and applies the second effect parameter to the at least one audio effect to facilitate controlling application of the at least one audio effect to a second audio frequency band of the audio signals.

13. The system of claim 1, wherein the audio processor component facilitates presentation of the processed audio signals to the user via an audio interface.

14. The system of claim 1, wherein the one or more audio effects comprise at least one of a spatial widening effect, a delay effect, a reverb effect, an equalizer effect, or a panning effect.

15. A method, comprising:
    sensing, by a system comprising a processing device, a set of brain wave signals associated with brain activity of a user, wherein the set of brain wave signals comprises at least a first brain wave signal associated with a first frequency band and a second brain wave signal associated with a second frequency band; and
    controlling, by the system, application of a set of audio effects to audio signals generated by an audio device, based at least in part on a result of an analysis of the set of brain wave signals, to generate processed audio signals for presentation to the user, wherein the result comprises a first signal strength of the first brain wave signal associated with the first frequency band and a second signal strength of the second brain wave signal associated with the second frequency band.

16. The method of claim 15, further comprising:
monitoring, by the system, the set of brain wave signals associated with the brain activity of the user, wherein the sensing the set of brain wave signals comprises sensing changes in the set of brain wave signals associated with the brain activity of the user in response to presentation of at least one of the audio signals or the processed audio signals to the user.

17. The method of claim 15, further comprising:
analyzing, by the system, the set of brain wave signals and the audio signals to facilitate determining a set of effect parameters to apply to the set of audio effects.

18. The method of claim 17, further comprising:
determining, by the system, the set of effect parameters based at least in part on the result of the analysis of the set of brain wave signals and another result of the analysis of the audio signals.

19. The method of claim 18, further comprising:
applying, by the system, the set of effect parameters to at least one audio effect of the set of audio effects to facilitate controlling application of the at least one audio effect to the audio signals.

20. The method of claim 17, further comprising:
determining, by the system, respective signal strengths of respective brain wave signals of the set of brain wave signals based at least in part on the result of the analysis of the set of brain wave signals, wherein the respective signal strengths comprise the first signal strength and the second signal strength.

21. The method of claim 20, wherein the audio signals are multiple-channel audio signals.

22. The method of claim 21, wherein the one or more audio effects comprises a spatial widening effect, and wherein the method further comprises:
modifying, by the system, a level of spatial widening of the spatial widening effect applied to the multiple-channel audio signals based at least in part on the respective signal strengths of the respective brain wave signals of the set of brain wave signals.

23. The method of claim 22, wherein the modifying the level of spatial widening of the spatial widening effect applied to the multiple-channel audio signals comprises at least one of periodically or randomly modifying the level of widening of the spatial widening effect applied to the multiple-channel audio signals.

24. The method of claim 21, further comprising:
applying, by the system a delay effect to the multiple-channel audio signals to facilitate generating delayed multiple-channel audio signals; and
modifying, by the system, a level of spatial widening of the spatial widening effect applied to the delayed multiple-channel audio signals based at least in part on the respective signal strengths of the respective brain wave signals of the set of brain wave signals.

25. The method of claim 24, wherein the modifying the level of spatial widening of the spatial widening effect applied to the delayed multiple-channel audio signals comprises at least one of periodically or randomly modifying the level of widening of the spatial widening effect applied to the delayed multiple-channel audio signals.

26. The method of claim 17, further comprising:
determining, by the system, the first signal strength of the first brain wave signal associated with the first frequency band;
determining, by the system, the second signal strength of the second brain wave signal associated with the second frequency band;
determining, by the system, a first effect parameter of the set of effect parameters based at least in part on the first signal strength associated with the first frequency band; and
determining, by the system, a second effect parameter of the set of effect parameters based at least in part on the second signal strength associated with the second frequency band.

27. The method of claim 26, further comprising:
applying, by the system, the first effect parameter and the second effect parameter to at least one audio effect of the set of audio effects to facilitate controlling application of the at least one audio effect to the audio signals to facilitate the generating of the processed audio signals.

28. The method of claim 26, further comprising:
applying, by the system, the first effect parameter to at least one audio effect of the set of audio effects to facilitate controlling application of the at least one audio effect to a first audio frequency band of the audio signals to facilitate the generating of the processed audio signals; and
applying, by the system, the second effect parameter to the at least one audio effect to facilitate controlling application of the at least one audio effect to a second audio frequency band of the audio signals to facilitate the generating of the processed audio signals.

29. A non-transitory computer-readable medium storing computer-executable instructions that, in response to execution, cause a system comprising a processor to perform operations, comprising:
detecting a set of brain wave signals associated with brain activity of a user, wherein the set of brain wave signals comprises at least a first brain wave signal associated with a first frequency band and a second brain wave signal associated with a second frequency band; and
managing application of a set of audio effects to multiple-channel audio signals generated by an audio system, based at least in part on a result of analyzing the set of brain wave signals that relates to a first signal level of the first brain wave signal associated with the first frequency band and a second signal level of the second brain wave signal associated with the second frequency band, to generate processed audio signals for presentation to the user.

30. The non-transitory computer-readable medium of claim 29, wherein the set of audio effects comprises a spatial widening effect, and wherein the operations further comprise:
monitoring the set of brain wave signals associated with the brain activity of the user, wherein the detecting the set of brain wave signals comprises detecting a variation in the set of brain wave signals associated with the brain activity of the user in response to presentation of at least one of the audio signals or the processed audio signals to the user; and
adjusting a level of spatial widening of the spatial widening effect applied to the multiple-channel audio signals in response to the variation in the set of brain wave signals.

31. A system, comprising:
means for sensing a set of signals associated with brain activity of a user, wherein the set of signals comprises at least a first signal associated with a first frequency band and a second signal associated with a second frequency band; and means for controlling application of a set of audio effects to multiple-channel audio signals generated by an audio system, based at least in part on a result of an analysis of the set of signals that relates to a first signal strength of the first signal associated with the first frequency band and a second signal strength of the second signal associated with the second frequency band, to generate processed audio signals for presentation to the user.

32. The system of claim 31, wherein the set of audio effects comprises a spatial effect, and wherein the system further comprises:
means for monitoring the set of signals associated with the brain activity of the user, wherein the means for sensing comprises means for sensing a variation in at least one of the first signal strength of the first signal or the second signal strength of the second signal in response to presentation of at least one of the audio signals or the processed audio signals to the user; and
means for modifying a level of spatial widening of the spatial effect applied to the multiple-channel audio signals based at least in part on the variation in at least one of the first signal strength of the first signal or the second signal strength of the second signal.

\* \* \* \* \*